(12) United States Patent
Chang et al.

(10) Patent No.: US 12,027,221 B2
(45) Date of Patent: Jul. 2, 2024

(54) INTEGRATED CIRCUIT DEVICE

(71) Applicant: TAIWAN SEMICONDUCTOR MANUFACTURING COMPANY, LTD., Hsinchu (TW)

(72) Inventors: Meng-Sheng Chang, Hsinchu (TW); Yao-Jen Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/815,141

(22) Filed: Jul. 26, 2022

(65) Prior Publication Data
US 2022/0359027 A1 Nov. 10, 2022

Related U.S. Application Data

(62) Division of application No. 17/143,702, filed on Jan. 7, 2021, now Pat. No. 11,443,819.

(60) Provisional application No. 63/056,281, filed on Jul. 24, 2020.

(51) Int. Cl.
| G11C 17/18 | (2006.01) |
| G11C 17/16 | (2006.01) |
| H10B 20/20 | (2023.01) |

(52) U.S. Cl.
CPC .............. G11C 17/18 (2013.01); G11C 17/16 (2013.01); H10B 20/20 (2023.02)

(58) Field of Classification Search
CPC ................................ H10B 20/20; G11C 17/18
USPC ......................................................... 365/96
See application file for complete search history.

(56) References Cited

U.S. PATENT DOCUMENTS

| 7,173,851 | B1 | 2/2007 | Callahan et al. |
| 7,260,442 | B2 | 8/2007 | Hwang et al. |
| 9,245,648 | B1 | 1/2016 | Li et al. |
| 9,256,709 | B2 | 2/2016 | Yu et al. |
| 9,583,167 | B2 * | 2/2017 | Chan ...................... H10B 61/22 |
| 10,141,035 | B1 | 11/2018 | Huang et al. |
| 10,147,470 | B2 | 12/2018 | Cheng |

(Continued)

FOREIGN PATENT DOCUMENTS

| KR | 20150022744 | 3/2015 |
| TW | 201832241 | 9/2018 |
| TW | 202016929 | 5/2020 |

OTHER PUBLICATIONS

Office Action dated Mar. 15, 2022 for corresponding case No. TW 11120257690. (pp. 1-6).

*Primary Examiner* — Muna A Techane
(74) *Attorney, Agent, or Firm* — Hauptman Ham, LLP

(57) ABSTRACT

An integrated circuit (IC) device includes a first active region extending along a first direction, a first pair of gate regions extending across the first active region along a second direction transverse to the first direction, and a first metal layer. The first pair of gate regions and the first active region configure a first program transistor and a first read transistor sharing a common source/drain region. The first metal layer includes a first program word line pattern over and coupled to the gate region of the first program transistor, a first read word line pattern over and coupled to the gate region of the first read transistor, a first source line pattern coupled to another source/drain region of the first program transistor, and a first bit line pattern coupled to another source/drain region of the first read transistor.

20 Claims, 16 Drawing Sheets

(56) References Cited

U.S. PATENT DOCUMENTS

| | | | |
|---|---|---|---|
| 2008/0203443 A1* | 8/2008 | Wilson | H01L 27/1203 |
| | | | 257/295 |
| 2009/0080246 A1* | 3/2009 | Jenne | G11C 16/3418 |
| | | | 365/185.02 |
| 2010/0188888 A1 | 7/2010 | Adams et al. | |
| 2011/0044112 A1* | 2/2011 | Torii | H10B 41/30 |
| | | | 257/315 |
| 2014/0040838 A1 | 2/2014 | Liu et al. | |
| 2015/0023105 A1* | 1/2015 | Widjaja | H01L 29/70 |
| | | | 257/315 |
| 2015/0278429 A1 | 10/2015 | Chang | |
| 2018/0075900 A1* | 3/2018 | Ishizu | G11C 11/419 |

\* cited by examiner

INTEGRATED CIRCUIT DEVICE

RELATED APPLICATION(S)

The instant application is a divisional application of application Ser. No. 17/143,702, filed Jan. 7, 2021, now U.S. Pat. No. 11,443,819, issued Sep. 13, 2022, which claims the benefit of U.S. Provisional Application No. 63/056,281, filed Jul. 24, 2020. The above-listed applications and patent are incorporated by reference herein in their entireties.

BACKGROUND

An integrated circuit (IC) device includes a number of semiconductor devices represented in an IC layout diagram. An IC layout diagram is hierarchical and includes modules which carry out higher-level functions in accordance with the semiconductor device design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs. Examples of semiconductor devices and cells correspondingly include memory devices and memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 2:
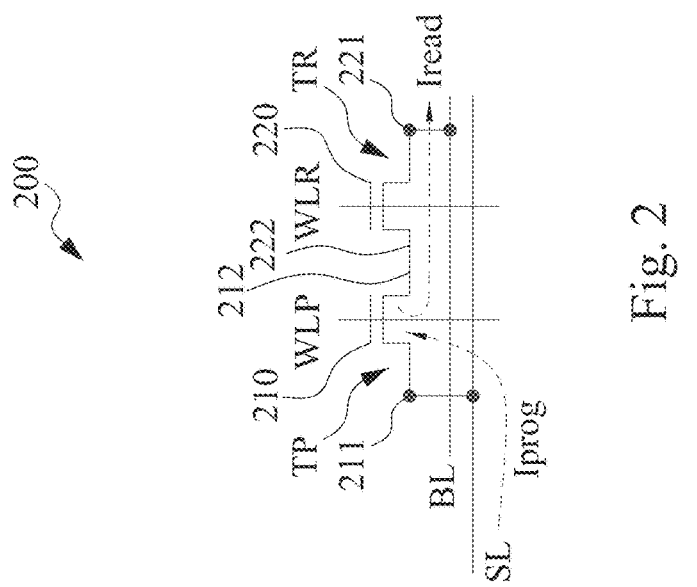
FIG. 2 is schematic circuit diagram of a memory cell, in accordance with some embodiments.

The following disclosure provides many different embodiments, or examples, for implementing different features of the provided subject matter. Specific examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Source/drain(s) may refer to a source or a drain, individually or collectively dependent upon the context.

A memory cell comprises a program transistor and a read transistor coupled in series to each other. In some embodiments, in a programming operation of the memory cell, a higher voltage is applied to a source or a drain of the program transistor, and a lower voltage is applied to a gate of the program transistor. A voltage difference between the higher voltage and the lower voltage is applied across a gate dielectric of the program transistor, and is equal to or higher than a predetermined breakdown voltage that is sufficient to break down the gate dielectric. As a result, the memory cell is programmed to store a first datum corresponding to the broken-down gate dielectric. When the gate dielectric is not yet broken down, the memory cell stores a second datum different from the first datum. In an example, the first datum is logic "0" and the second datum is logic "1." In another example, the first datum is logic "1" and the second datum is logic "0." Compared to other approaches where a higher voltage is applied to a gate terminal, instead of a source or a drain, of a program transistor in a programming operation, it is possible in at least one embodiment to achieve one or more improvements including, but not limited to, reduced leakage current, increased reliability, or the like.

Figure 1:
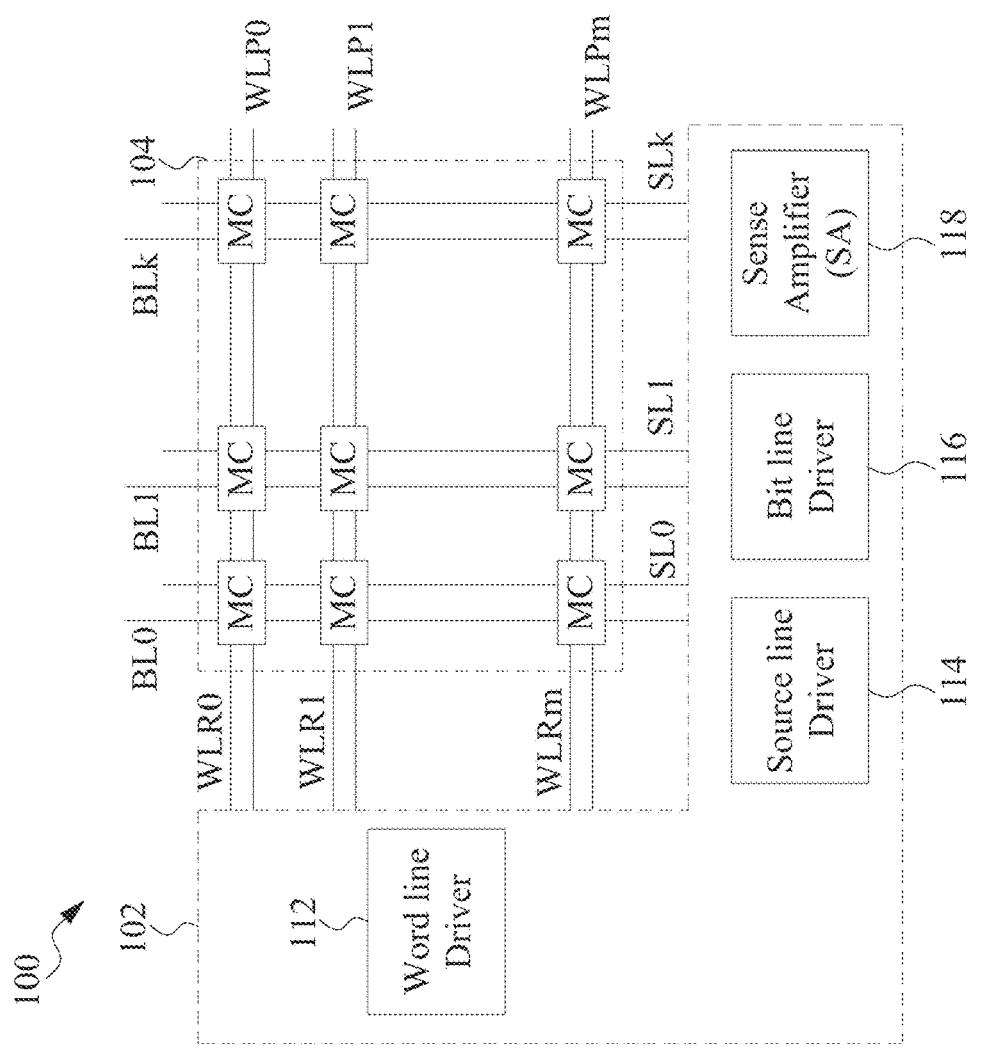
FIG. 1 is a schematic block diagram of a memory device, in accordance with some embodiments.

FIG. 1 is a schematic block diagram of a memory device 100, in accordance with some embodiments. A memory device is a type of an IC device. In at least one embodiment, a memory device is an individual IC device. In some embodiments, a memory device is included as a part of a larger IC device which comprises circuitry other than the memory device for other functionalities.

The memory device 100 comprises at least one memory cell MC and a controller (also referred to as "control circuit") 102 coupled to control an operation of the memory cell MC. In the example configuration in FIG. 1, the memory device 100 comprises a plurality of memory cells MC arranged in a plurality of columns and rows in a memory array 104. The memory device 100 further comprises a plurality of read word lines WLR0, WLR1 to WLRm and a plurality of program word lines WLP0, WLP1 to WLPm extending along the rows of the memory array 104. The memory device 100 further comprises a plurality of source lines SL0, SL1 to SLk and a plurality of bit lines BL0, BL1 to BLk extending along the columns of the memory array 104. The read word lines are commonly referred to herein as WLR, the program word lines are commonly referred to herein as WLP, the read word lines WLR and the program word lines WLP are commonly referred to herein as word lines, the source lines are commonly referred to herein as SL, and the bit lines are commonly referred to herein as BL. Each of the memory cells MC is coupled to the controller 102 by a corresponding read word line WLR, a corresponding program word line WLP, a corresponding source line SL, and a corresponding bit line BL. The read word lines WLR and/or the program word lines WLP are configured for transmitting addresses of memory cells MC to be read from, and/or to be written to, or the like. The read word lines WLR and/or the program word lines WLP are sometimes referred to as "address lines." The source lines SL and/or the bit lines BL are configured for transmitting data to be written to, and/or read from, the memory cells MC indicated by addresses on the corresponding word lines WLR, WLP, or the like. The source lines SL and/or the bit lines BL are sometimes referred to as "data lines." Various numbers of word lines WLR, WLP and/or bit lines BL and/or source lines SL in the memory device 100 are within the scope of various embodiments.

In the example configuration in FIG. 1, the controller 102 comprises a word line driver 112, a source line driver 114, a bit line driver 116, and a sense amplifier (SA) 118 which are configured to perform at least one of a read operation or a write operation. In at least one embodiment, the controller 102 further includes one or more clock generators for providing clock signals for various components of the memory device 100, one or more input/output (I/O) circuits for data exchange with external devices, and/or one or more controllers for controlling various operations in the memory device 100.

The word line driver 112 (also referred as "WL decoder") is coupled to the memory array 104 via the word lines WLR, WLP. The word line driver 112 is configured to decode a row address of the memory cell MC selected to be accessed in a read operation or a write operation. The word line driver 112 is configured to supply a set of voltages to the selected word lines WLR, WLP corresponding to the decoded row address, and a different set of voltages to the other, unselected word lines WLR, WLP. The source line driver 114 (also referred as "SL decoder") is coupled to the memory array 104 via the source lines SL. The bit line driver 116 (also referred as "BL decoder") is coupled to the memory array 104 via the bit lines BL. The source line driver 114 and/or the bit line driver 116 is/are configured to decode a column address of the memory cell MC selected to be accessed in a read operation or a write operation. The source line driver 114 and/or the bit line driver 116 is/are configured to supply a set of voltages to the selected source line SL and the selected bit line BL corresponding to the selected memory cell MC, and a different set of voltages to the other, unselected source lines SL and unselected bit lines BL. For example, in a write operation (also referred to as "programming operation"), the source line driver 114 is configured to supply a write voltage (also referred to as "program voltage") to the selected source line SL. In a read operation, the source line driver 114 is configured to supply a read voltage to the selected source line SL. The SA 118 is coupled to the memory array 104 via the bit lines BL. In a read operation, the SA 118 is configured to sense data read from the accessed memory cell MC and retrieved through the corresponding selected bit line BL. The described memory device configuration is an example, and other memory device configurations are within the scopes of various embodiments. In at least one embodiment, the memory device 100 is a one-time programmable (OTP) non-volatile memory, and the memory cells MC are OTP memory cells. Other types of memory are within the scopes of various embodiments.

FIG. 2 is schematic circuit diagram of a memory cell 200, in accordance with some embodiments. In at least one embodiment, the memory cell 200 corresponds to at least one of the memory cells MC in the memory device 100.

In FIG. 2, the memory cell 200 is coupled to a program word line WLP, a read word line WLR, a source line SL, and a bit line BL. The memory cell 200 comprises a program transistor TP and a read transistor TR. The program transistor TP comprises a gate terminal 210 coupled to the program word line WLP, a first terminal 211 coupled to the source line SL, and a second terminal 212. The read transistor TR comprises a gate terminal 220 coupled to the read word line WLR, a first terminal 221 coupled to the bit line BL, and a second terminal 222 coupled to the second terminal 212 of the program transistor TP. In other words, the program transistor TP and the read transistor TR are serially coupled with each other.

Examples of the program transistor TP and/or the read transistor TR include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. The first terminal 211 is a source/drain of the program transistor TP, and the second terminal 212 is another source/drain of the program transistor TP. The first terminal 221 is a source/drain of the read transistor TR, and the second terminal 222 is another source/drain of the read transistor TR. In the example configuration described with respect to FIG. 2, the program transistor TP and the read transistor TR are NMOS transistors, the first terminal 211 is a source of the program transistor TP, the second terminal 212 is a drain of the program transistor TP, the first terminal 221 is a drain of the read transistor TR, and the second terminal 222 is a source of the read transistor TR. Other configurations including PMOS transistors instead of NMOS transistors are within the scopes of various embodiments. In some embodiments described herein, the second terminal 212 of the program transistor TP and the second terminal 222 of the read transistor TR are the same, i.e., the program transistor TP and the read transistor TR share a common source/drain. In at least one embodiment, the program transistor TP and the read transistor TR are identically configured. For example, the program transistor TP and the read transistor TR have the same size, and are manufactured by the same processes.

The program transistor TP comprises a gate dielectric (such as a gate dielectric described with respect to FIG. 8) which is configured to be broken down when a predetermined breakdown voltage that is sufficient to break down the gate dielectric is applied across the gate dielectric. When the gate dielectric of the program transistor TP is broken down, the broken-down gate dielectric is configured as a resistor and corresponds to a first datum, e.g., logic "0," stored in the memory cell 200. When the gate dielectric is not yet broken down, the memory cell 200 stores a different, second datum, e.g., logic "1." Example materials of the gate dielectric include, but are not limited to, silicon dioxide, a high-k dielectric, or the like. Examples of high-k dielectrics include, but are not limited to, zirconium dioxide, hafnium dioxide, zirconium silicate, hafnium silicate, or the like. In some embodiments, the memory cell 200 is an anti-fuse memory cell, and a memory device comprising the memory cell 200 is an anti-fuse memory. An anti-fuse memory is a type of one-time programmable (OTP) non-volatile memory (NVM). Other memory configurations to which the memory cell 200 is applicable are within the scopes of various embodiments.

In some embodiments, operations of the memory cell 200 are controlled by a controller, such as the controller 102 of the memory device 100. The controller 102 is coupled to the memory cell 200 via the program word line WLP, the read word line WLR, the source line SL, and the bit line BL.

When the memory cell 200 is selected in a programming operation, the controller 102 is configured to apply a higher voltage via the source line SL to the first terminal 211 of the program transistor TP, and apply a lower voltage via the program word line WLP to the gate terminal 210 of the program transistor TP. The controller 102 is configured to turn OFF the read transistor TR in the programming operation. A voltage difference between the higher voltage on the first terminal 211 and the lower voltage on the gate terminal 210 is equal to or higher than the predetermined breakdown voltage that is sufficient to break down the gate dielectric of the program transistor TP. As a result, the gate dielectric of the program transistor TP is broken down, a programming current Iprog flows from the source line SL through the program transistor TP to the program word line WLP, and the memory cell 200 is programmed. In an example, the lower voltage applied to the program word line WLP is a ground voltage, and the higher voltage applied to the source line SL is a program voltage of about 5V. Other voltage schemes are within the scopes of various embodiments.

When the memory cell 200 is selected in a read operation, the controller 102 is configured to apply a turn-ON voltage via the read word line WLR to the gate terminal 220 of the read transistor to turn ON the read transistor TR. The controller 102 is further configured to apply a read voltage via the source line SL and the program word line WLP correspondingly to the first terminal 211 and the gate terminal 210 of the program transistor TP to detect, while the read transistor TR is turned ON, a datum stored in the memory cell 200. For example, the controller 102 is configured to sense, e.g., by using the SA 118, a read current Tread flowing from the program transistor TP through the turned ON read transistor TR to the bit line BL. A current value of the read current Tread when the memory cell 200 has been previously programmed to store logic "0" is different from a current value of the read current Tread when the memory cell 200 has not been previously programmed and still stores logic "1." By sensing the current value of the read current Tread, the controller 102 is configured to detect the datum stored in the memory cell 200. In an example, the turn-ON voltage is a core voltage of about 0.75V, and the read voltage is about 1.5V. Other voltage schemes are within the scopes of various embodiments.

Compared to other approaches where a high program voltage is applied to a gate terminal of a program transistor, a program voltage, in accordance with some embodiments, is applied to a source/drain of the program transistor TP via the source line SL. Further, in other approaches, a programming current and a read current flow in the same current path from a program transistor to a bit line. In contrast, the programming current Iprog and the read current Tread, in accordance with some embodiments, flow in different current paths as schematically illustrated in FIG. 2. In at least one embodiment, one of more of the described distinctions from the other approaches make it possible to achieve one or more improvements described herein.

Figure 3A:
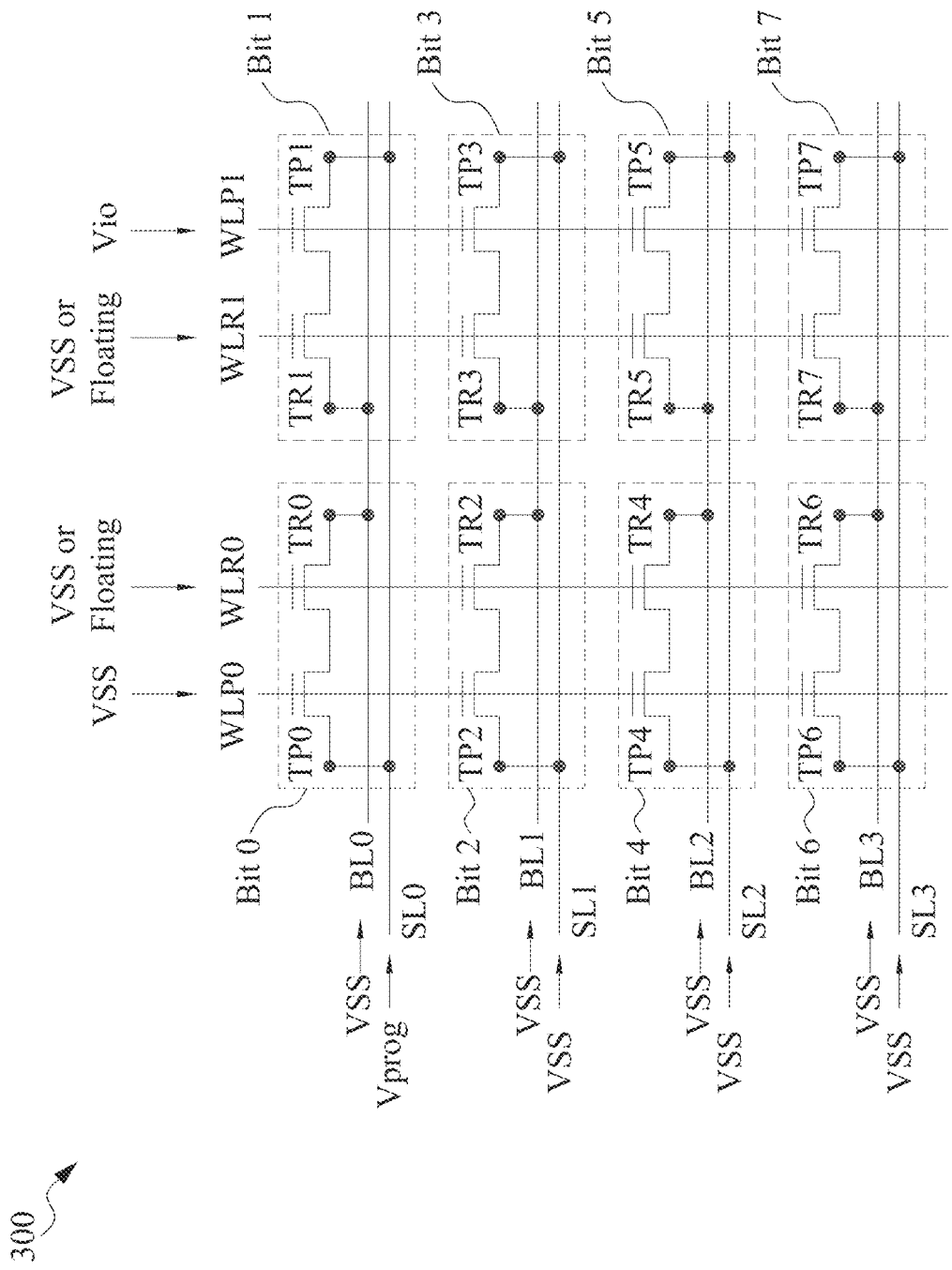
FIGS. 3A-3B are schematic circuit diagrams of a memory device in various operations, in accordance with some embodiments.
Figure 3B:
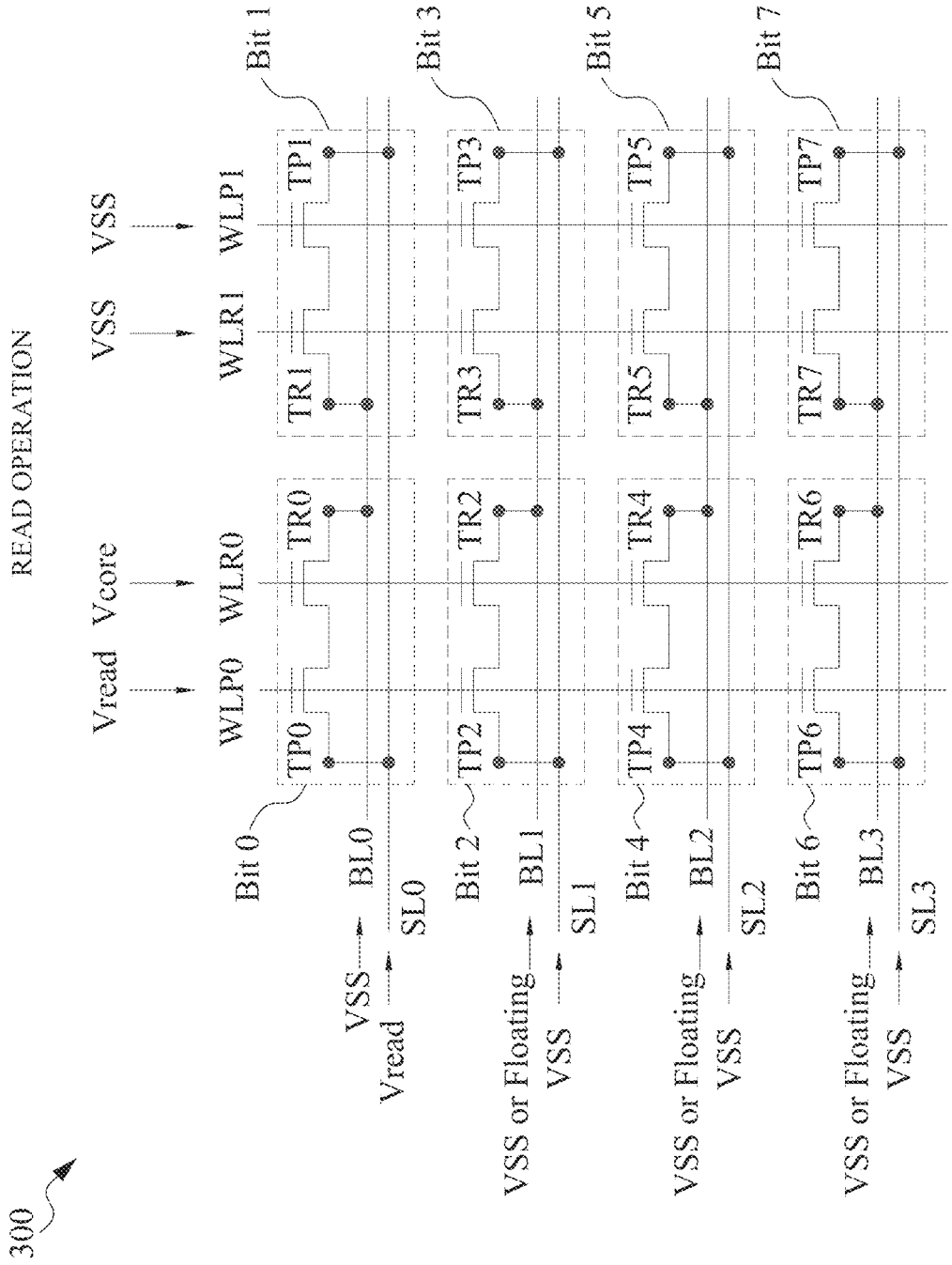

FIGS. 3A-3B are schematic circuit diagrams of a memory device 300 in various operations, in accordance with some embodiments.

In FIGS. 3A and 3B, the memory device 300 comprises a plurality of memory cells Bit 0, Bit 1, . . . Bit 7. Each of the memory cells Bit 0, Bit 1, . . . Bit 7 has the configuration of the memory cell 200. For example, the memory cells Bit 0, Bit 1, . . . Bit 7 correspondingly comprise program transistors TP0, TP1, . . . TP7, and read transistors TR0, TR1, . . . TR7. The gate terminals of the program transistors TP0, TP2, TP4, TP6 are coupled to a program word line WLP0, and the gate terminals of the program transistors TP1, TP3, TP5, TP7 are coupled to a program word line WLP1. The gate terminals of the read transistors TR0, TR2, TR4, TR6 are coupled to a read word line WLR0, and the gate terminals of the read transistors TR1, TR3, TR5, TR7 are coupled to a read word line WLR1. First terminals of the program transistors TP0, TP1 are coupled to a source line SL0, first terminals of the program transistors TP2, TP3 are coupled to a source line SL1, first terminals of the program transistors TP4, TP5 are coupled to a source line SL2, and first terminals of the program transistors TP6, TP7 are coupled to a source line SL3. First terminals of the read transistors TR0, TR1 are coupled to a bit line BL0, first terminals of the read transistors TR2, TR3 are coupled to a bit line BL1, first terminals of the read transistors TR4, TR5 are coupled to a bit line BL2, and first terminals of the read transistors TR6, TR7 are coupled to a bit line BL3. A second terminal of each of the program transistors TP0, TP1, . . . TP7 and a second terminal of a corresponding one of the read transistors TR0, TR1, . . . TR7 are coupled together. In at least one embodiment, each of the memory cells Bit 0, Bit 1, . . . Bit 7 corresponds to a memory cell MC, each of the bit lines BL0, BL1, BL2, BL3 corresponds to a bit line BL, each of the source lines SL0, SL1, SL2, SL3 corresponds to a source line SL, each of the program word lines WLP0, WLP1 corresponds to a program word line WLP, and each of the read word lines WLR0, WLR1 corresponds to a read word line WLR in the memory device 100. The configuration of the memory device 300 in FIGS. 3A-3B is an example. Other configurations are within the scopes of various embodiments.

In FIG. 3A, the memory cell Bit 0 is selected in a programming operation and the other memory cells Bit 1, Bit 2, . . . Bit 7 are not selected. A controller of the memory device 300, such as the controller 102, is configured to apply a program voltage Vprog to the source line SL0 coupled to the selected memory cell Bit 0, and apply a reference voltage to the other source lines SL1, SL2, SL3. In the example configuration in FIG. 3A, the reference voltage is the ground voltage VSS, and the program voltage Vprog is about 5V. Other voltage schemes are within the scopes of various embodiments.

The controller is further configured to apply the ground voltage VSS to the program word line WLP0 coupled to the selected memory cell Bit 0, and apply a first voltage Vio to the other program word line WLP1. The first voltage Vio is higher than the ground voltage VSS and lower than the program voltage Vprog. In an example, the first voltage Vio is an input/output (I/O) voltage of about 1.8V. Other voltage schemes are within the scopes of various embodiments.

The controller is further configured to either float or apply the ground voltage VSS to each read word line WLR0, WLR1. As a result, the read transistors TR0, TR1, . . . TR7 are turned OFF. The controller is further configured to apply the ground voltage VSS to the bit lines BL0, BL1, BL2, BL3.

A voltage difference, e.g., 5V, between the program voltage Vprog and the ground voltage VSS is equal to or higher than a predetermined breakdown voltage and is sufficient to break down a gate dielectric of the program transistor TP0 in the selected memory cell Bit 0. As a result the selected memory cell Bit 0 is programmed.

A voltage difference, e.g., 3.2V, between the program voltage Vprog and the first voltage Vio is lower than the predetermined breakdown voltage, to avoid unintendedly breaking down the gate dielectric (if not yet broken down) of the program transistor TP1 in the unselected memory cell Bit 1 which is coupled to the same source line SL0 as the selected memory cell Bit 0.

A voltage difference, e.g., 1.8V, between the first voltage Vio and the ground voltage VSS is lower than the predetermined breakdown voltage, to avoid unintendedly breaking down the gate dielectrics (if not yet broken down) of the program transistors TP3, TP5, TP7 in the unselected memory cells Bit 3, Bit 5, Bit 7.

In other approaches where a high program voltage is applied via a program word line to a gate terminal of a program transistor in a selected memory cell, other unselected memory cells coupled to the same program word line potentially experience undesirable additional leakage currents due to the gate-induced drain leakage (GIDL) effect. Further, the high program voltage on the program word line potentially creates undesirable high voltage stresses on program transistors in the other unselected memory cells, and results in reduced reliability of the program transistors in the other unselected memory cells. In at least one embodiment, by applying the program voltage Vprog to a source/drain, instead of the gate terminal, of the program transistor TP0 of the selected memory cell Bit 0, it is possible to avoid additional leakage currents and/or reduced reliability in other, unselected memory cells Bit 2, Bit 4, Bit 6 which are coupled to the same program word line WLP0 as the selected memory cell Bit 0. As a result, performance and/or device reliability is/are enhanced in one or more embodiments.

In FIG. 3B, the memory cell Bit 0 is selected in a read operation and the other memory cells Bit 1, Bit 2, . . . Bit 7 are not selected. The controller is configured to apply a read voltage Vread to the source line SL0 and the program word line WLP0 coupled to the selected memory cell Bit 0, and apply the ground voltage VSS to the other source lines SL1, SL2, S13 and the other program word line WLP1. In an example, the read voltage Vread is about 1.5V. Other voltage schemes are within the scopes of various embodiments.

The controller is further configured to apply a second voltage Vcore higher than the ground voltage VSS to the read word line WLR0 coupled to the selected memory cell Bit 0, and apply the ground voltage VSS to other read word line WLR1. The second voltage is also referred to a turn-ON voltage. In an example, the second voltage Vcore is a core voltage of about 0.75V. Other voltage schemes are within the scopes of various embodiments.

The controller is configured to apply the ground voltage VSS to the bit line BL0 coupled to the selected memory cell Bit 0. The controller is further configured to either float or apply the ground voltage VSS to each of the other bit lines BL1, BL2, BL3.

The controller is further configured to couple the bit line BL0 of the selected memory cell Bit 0 to a sense amplifier, such as the SA 118. The turn-ON voltage Vcore on the read word line WLR0 causes the read transistor TR0 to turn ON, which permits a read current to flow from the program transistor TP0 to the bit line BL0 to be detected by the SA.

Figure 4:
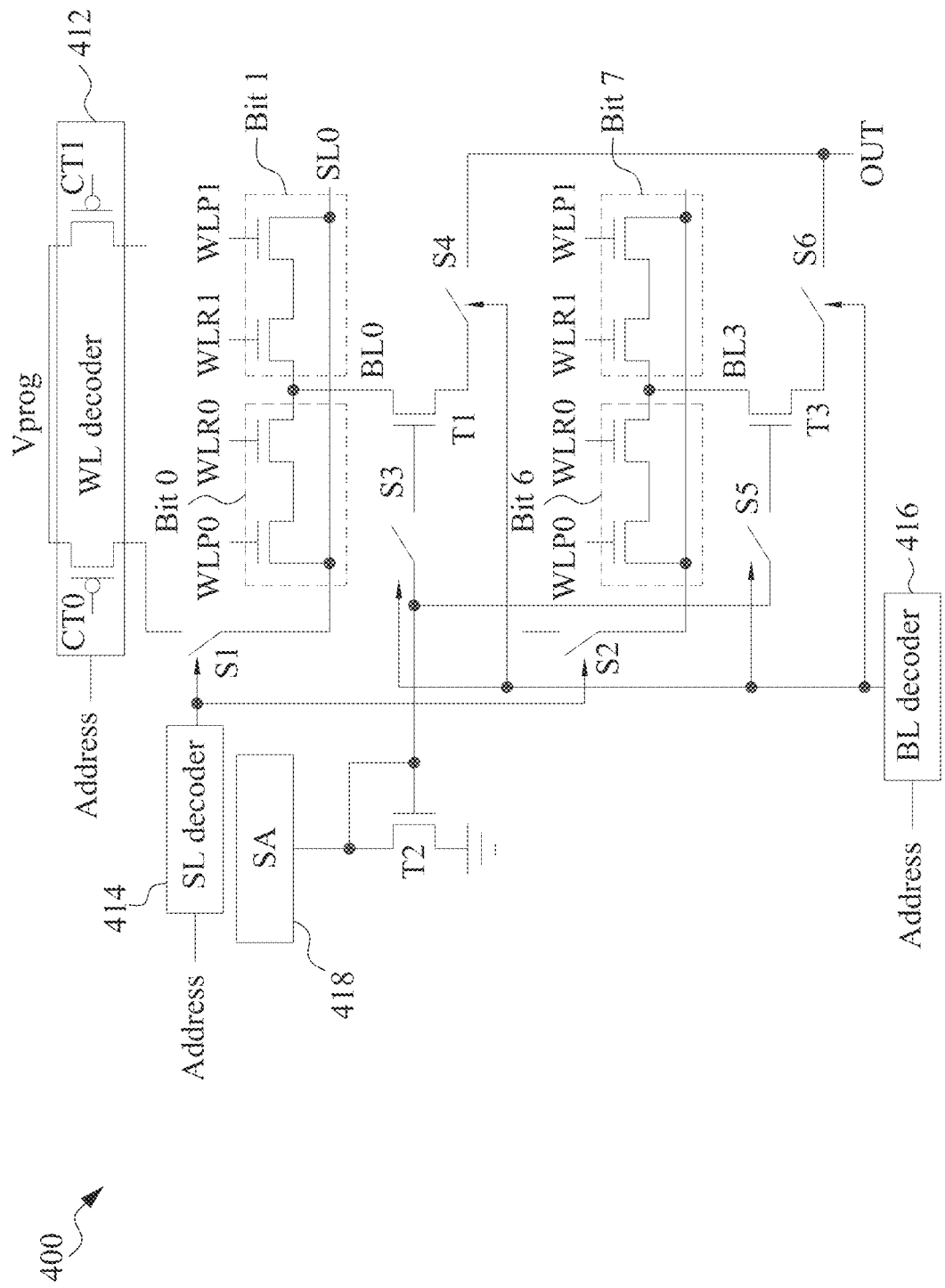
FIG. 4 is a schematic circuit diagram of a memory device, in accordance with some embodiments.

FIG. 4 is a schematic circuit diagram of a memory device 400, in accordance with some embodiments.

The memory device 400 comprises the memory cells Bit 0, Bit 1, . . . Bit 7, and the corresponding program word lines WLP0, WLP1, read word lines WLR0, WLR1, source lines SL0, SL1, SL2, SL3, and bit lines BL0, BL1, BL2, BL3 described with respect to FIGS. 3A-3B. For simplicity, some of the memory cells, source lines and bit lines are omitted in FIG. 4. The memory device 400 further comprises a WL decoder 412, a SL decoder 414, a BL decoder 416, and an SA 418 which together configure a controller corresponding to the controller described with respect to FIGS. 3A-3B. In at least one embodiment, the WL decoder 412, SL decoder 414, BL decoder 416, and SA 418 correspond to the word line driver 112, source line driver 114, bit line driver 116, and SA 118 described with respect to FIG. 1.

The WL decoder 412 is configured to receive and decode the address of a selected memory cell, and to apply various voltages to one or more of the program word lines WLP0, WLP1, read word lines WLR0, WLR1, and source lines SL0, SL1, SL2, SL3, in accordance with the decoded address and the operation, e.g., a read operation or a programming operation, to be performed at the selected memory cell. For example, the program voltage Vprog and transistors CT0, CT1, through which the program voltage Vprog is selectively applied to source lines SL, are shown in FIG. 4. Other voltages and/or transistors for selectively applying such voltages are omitted for simplicity.

The SL decoder 414 is configured to receive and decode the address of the selected memory cell, and to control supply of various voltages from the WL decoder 412 to one or more of the source lines SL0, SL1, SL2, SL3, in accordance with the decoded address and the operation to be performed at the selected memory cell. For example, the SL decoder 414 is coupled to a control terminal of a switch S1 which is coupled between the source line SL0 and the transistor CT0 in the WL decoder 412. Similarly, the SL decoder 414 is coupled to a control terminal of a switch S2 which is coupled between the source line SL3 and another transistor in the WL decoder 412. Other switches coupled to be controlled by the SL decoder 414 are omitted for simplicity. In at least one embodiment, each of the switches S1, S2 is a transistor and the SL decoder 414 is coupled to a gate terminal of the transistor. In an example programming operation of the selected memory cell Bit 0, the SL decoder 414 is configured to close the switch S1 and the program voltage Vprog is supplied through the transistor CT0 and the closed switch S1 to the source line SL0 to program the memory cell Bit 0, as described herein.

The BL decoder 416 is configured to receive and decode the address of the selected memory cell, and to couple one or more of the bit lines BL0, BL1, BL2, BL3 to the ground voltage VSS or the SA 418, or to float one or more of the bit lines BL0, BL1, BL2, BL3, in accordance with the decoded address and the operation to be performed at the selected memory cell. For example, the BL decoder 416 is coupled to control terminals of switches S3-S6. The switch S3 is coupled between gates of transistors T1 and T2. The transistor T1 has a first source/drain coupled to the bit line BL0. The transistor T2 has a first source/drain coupled to the SA 418 and a second source/drain coupled to the ground. The switch S4 is coupled between a second source/drain of the transistor T1 and an output pin OUT. The switch S5 is coupled between gates of transistors T3 and T2. The transistor T3 has a first source/drain coupled to the bit line BL3. The switch S6 is coupled between a second source/drain of the transistor T3 and the output pin OUT. Other switches coupled to be controlled by the BL decoder 416 are omitted for simplicity. In at least one embodiment, each of the switches S3, S4, S5, S6 is a transistor and the BL decoder 416 is coupled to a gate terminal of the transistor. In an example read operation of the memory cell Bit 0, the BL decoder 416 is configured to close the switches S3, S4 to couple the bit line BL0 to the SA 418, for detecting a datum stored in the memory cell Bit 0 by the SA 418. In at least one embodiment, one or more advantages described herein are achievable in the memory device 400.

Figure 5A:
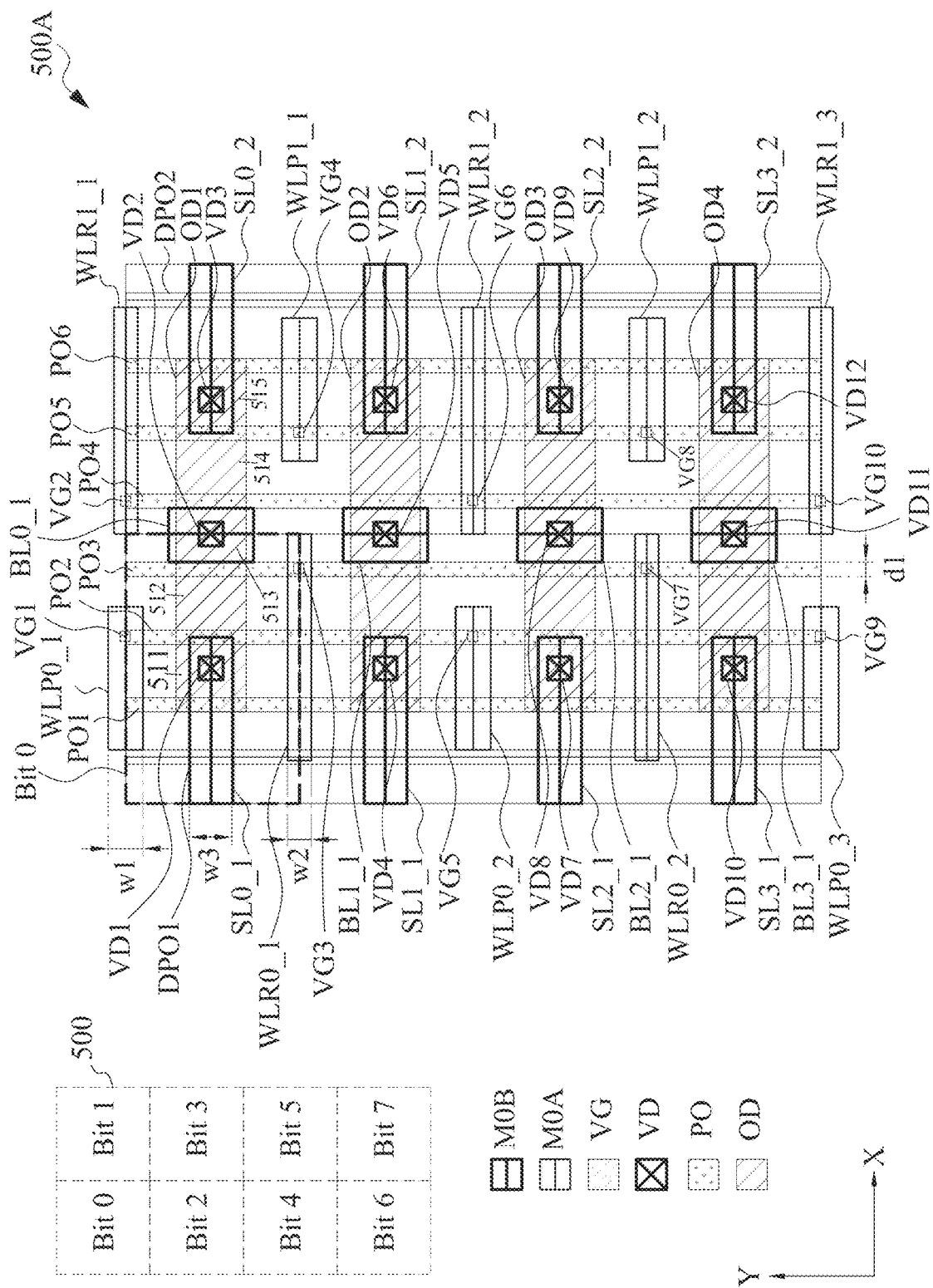
FIGS. 5A-5C are schematic views at various layers in an IC layout diagram of a memory device, in accordance with some embodiments.
Figure 5B:
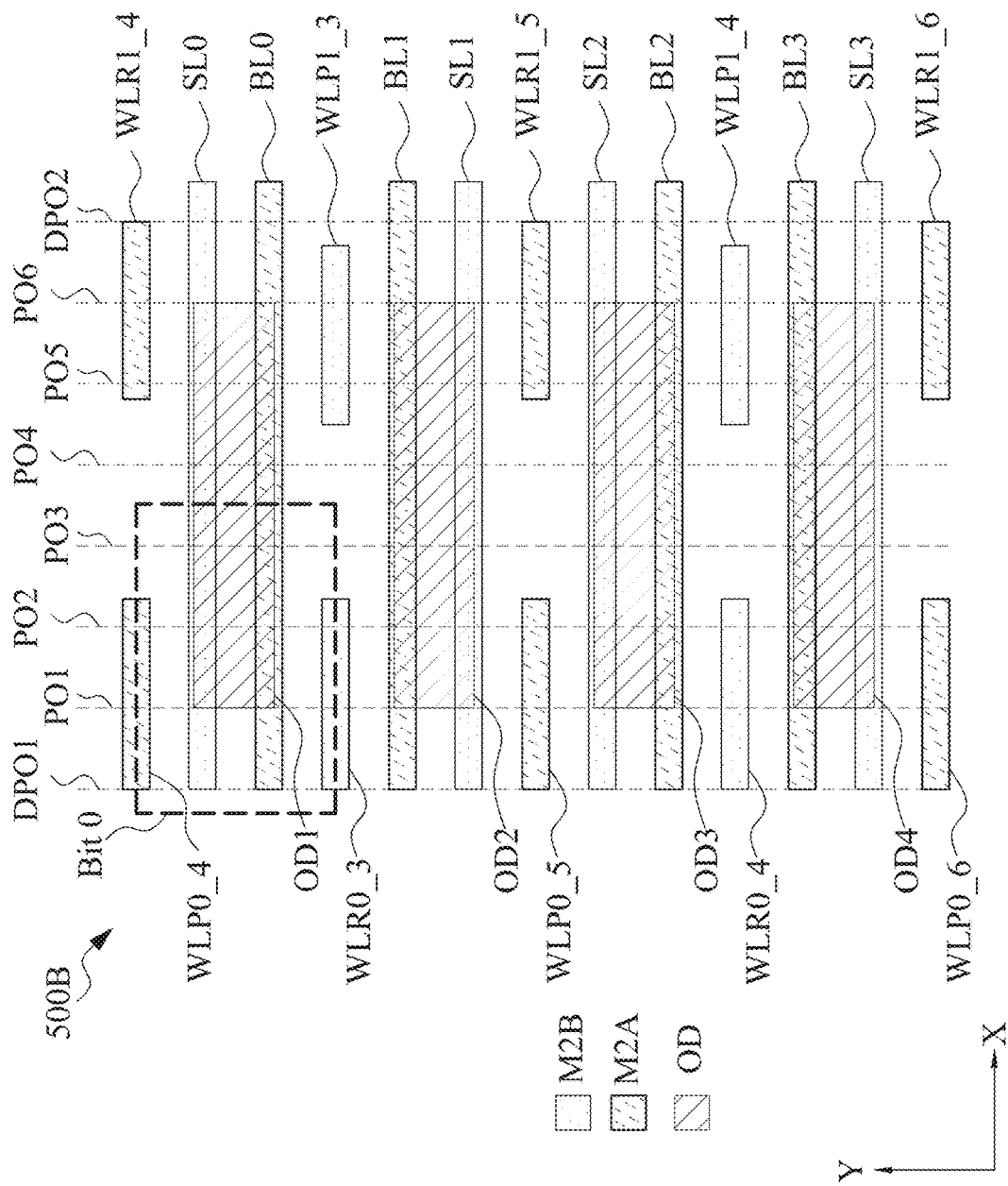
Figure 5C:
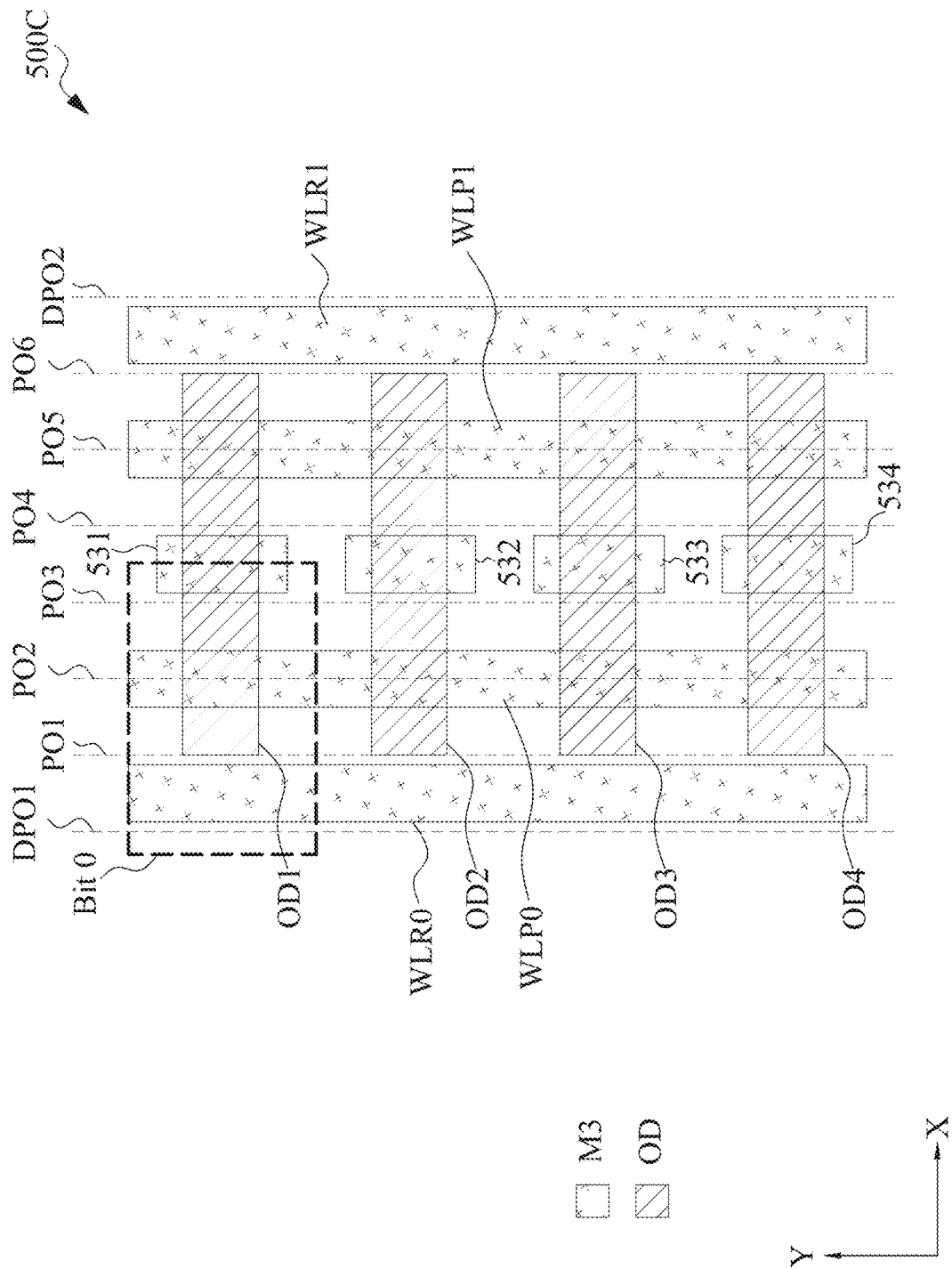

FIGS. 5A-5C are schematic views at various layers in an IC layout diagram 500 of a memory device, in accordance with some embodiments. In at least one embodiment, the IC layout diagram 500 corresponds to an IC layout diagram of the memory device 300.

The IC layout diagram 500 comprises memory cells Bit 0, Bit 1, . . . Bit 7 arranged in abutment with each other. A boundary of the memory cell Bit 0 is shown over schematic views 500A-500C of the layout in FIGS. 5A-5C, whereas boundaries of the other memory cells Bit 1, Bit 2, . . . Bit 7 are omitted in FIGS. 5A-5C for simplicity. In at least one embodiment, the IC layout diagram 500, and/or the layout diagram of one or more of the memory cells Bit 0, Bit 1, . . . Bit 7 are stored in a standard cell library on a non-transitory computer-readable medium.

FIG. 5A includes a schematic view 500A at a device level of the IC layout diagram 500.

The IC layout diagram 500 comprises active regions OD1, OD2, OD3, OD4, gate regions PO1, PO2 . . . PO6, dummy gate regions DPO1, DPO2. The active regions OD1, OD2, OD3, OD4 extend along a first direction, i.e., X direction. Active regions are sometimes referred to as oxide-definition (OD) regions, and are schematically illustrated in the drawings with the label "OD." The X direction is sometimes referred to as the OD direction. The active regions include P-type dopants and/or N-type dopants to form one or more circuit elements or devices. Examples of circuit elements include, but are not limited to, transistors and diodes. An active region configured to form one or more PMOS devices therein is referred to as "PMOS active region," and an active region configured to form one or more NMOS devices therein is referred to as "NMOS active region." For example, the active regions OD1, OD2, OD3, OD4 are both NMOS active regions configured to form NMOS transistors in the memory cells Bit 0, Bit 1, . . . Bit 7.

The gate regions PO1, PO2 . . . PO6 extend across the active regions OD1, OD2, OD3, OD4 along a second direction, i.e., Y direction, which is transverse to the X direction. In the example configuration in FIGS. 5A-5C, the Y direction is perpendicular to the X direction. Each of the gate regions PO1, PO2 . . . PO6 includes a conductive material, such as, polysilicon, and is schematically illustrated in the drawings with the label "PO." The Y direction is sometimes referred to as the Poly direction. Other conductive materials for the gate regions, such as metals, are within the scope of various embodiments.

The program transistor TP0 (not indicated in FIG. 5A) of the memory cell Bit 0 is configured by the gate region PO2 and corresponding source/drain regions 511, 512 in the active region OD1. In the X direction, the source/drain regions 511, 512 of the program transistor TP0 are immediately adjacent to, and located on opposite sides of, the gate region PO2. The read transistor TR0 (not indicated in FIG. 5A) of the memory cell Bit 0 is configured by the gate region PO3 and corresponding source/drain regions 512, 513 in the active region OD1. In the X direction, the source/drain regions 512, 513 of the read transistor TR0 are immediately adjacent to, and located on opposite sides of, the gate region PO3. In other words, the program transistor TP0 and the read transistor TR0 of the memory cell Bit 0 share a common source/drain region 512.

The program transistors and read transistors in the other memory cells Bit 1, Bit 2, . . . Bit 7 are configured similarly to the program transistor TP0 and read transistor TR0 in the memory cell Bit 0. For example, the program transistor TP1 (not indicated in FIG. 5A) of the memory cell Bit 1 is configured by the gate region PO5 and corresponding source/drain regions 514, 515 in the active region OD1. In the X direction, the source/drain regions 514, 515 of the program transistor TP1 are immediately adjacent to, and located on opposite sides of, the gate region PO5. The read transistor TR1 (not indicated in FIG. 5A) of the memory cell Bit 1 is configured by the gate region PO4 and corresponding source/drain regions 513, 514 in the active region OD1. In the X direction, the source/drain regions 513, 514 of the read transistor TR1 are immediately adjacent to, and located on opposite sides of, the gate region PO4. In other words, the program transistor TP1 and the read transistor TR1 of the memory cell Bit 1 share a common source/drain region 514, and the read transistor TR0 of the memory cell Bit 0 and the read transistor TR1 of the memory cell Bit 1 share a common source/drain region 513.

In the example configuration in FIG. 5A, the gate regions PO1, PO6 are dummy gate regions. For example, the gate regions PO1, PO6 correspond to conductive gates in a memory device manufactured based on the IC layout diagram 500; however, such conductive gates do not configure transistors and/or are not electrically coupled to other circuit elements. In contrast, the dummy gate regions DPO1, DPO2 correspond to non-conductive gates in a memory device manufactured based on the IC layout diagram 500. In at least one embodiment, the gate regions PO1, PO6 and/or the dummy gate regions DPO1, DPO2 are included in the IC layout diagram 500 to meet one or more design and/or manufacturing requirements. In at least one embodiment, one or more of the gate regions PO1, PO6 and/or the dummy gate regions DPO1, DPO2 is/are omitted. In the example configuration in FIG. 5A, the gate regions PO1, PO2 . . . PO6 and the dummy gate regions DPO1, DPO2 are arranged at a constant pitch (not shown in FIG. 5A) along the X direction, and have the same gate length d1 which is the dimension of a gate region or dummy gate region in the X direction. In at least one embodiment, the gate length d1 is about 9 nm.

In the example configuration in FIG. 5A, the active regions OD1, OD2, OD3, OD4 do not extend in the X direction beyond the gate regions PO1, PO6. When a further memory cell is placed in abutment with the left side of the memory cell Bit 0 in FIG. 5A, an active region in the further memory cell is non-contiguous with the active region OD1, resulting in a non-continuous active region configuration. Other active region configurations are within the scopes of various embodiments.

In some embodiments, the IC layout diagram 500 further comprises cut-Poly regions (not shown in FIG. 5A) extending in the X direction across the gate regions PO1, PO6, and corresponding to areas where the gate regions PO1, PO6 are not to be formed.

In some embodiments, the IC layout diagram 500 further comprises source/drain contact regions (not shown in FIG. 5A) which overlap and are configured to form electrical connections to the active regions OD1, OD2, OD3, OD4. The source/drain contact regions are sometimes referred to as "MD regions." The MD regions are arranged alternatingly with the gate regions PO1, PO2 . . . PO6 in the X direction.

The IC layout diagram 500 further comprises conductive vias over and in electrical contact with the corresponding gate regions or MD regions. A via over and in electrical contact with an MD region is sometimes referred to as via-to-device, and is schematically illustrated in the drawings with the label "VD." A via over and in electrical contact with a gate region is sometimes referred to as via-to-gate, and is schematically illustrated in the drawings with the label "VG." In the example configuration in FIG. 5A, the IC layout diagram 500 comprises vias VD1, VD2, . . . VD12, and vias VG1, VG2, . . . VG10.

The IC layout diagram 500 further comprises a plurality of metal layers and via layers sequentially and alternatingly arranged over the VD and VG vias. The lowermost metal layer immediately over and in electrical contact with the VD and VG vias is the M0 layer, i.e., metal-zero (M0) layer, a next metal layer immediately over the M0 layer is the M1 layer, a next metal layer immediately over the M1 layer is the M2 layer, or the like. A via layer VIAn is arranged between and electrically couple the Mn layer and the Mn+1 layer, where n is an integer form zero and up. For example, a via-zero (VIA0) layer is the lowermost via layer which is arranged between and electrically couple the M0 layer and the M1 layer. Other via layers are VIA1, VIA2, or the like.

In FIG. 5A, various patterns in the M0 layer are schematically labeled as "M0A" and "M0B." In at least one embodiment, M0A patterns correspond to one mask and M0B patterns correspond to another mask. The separation of the patterns in the M0 layer into several masks is to meet one or more design and/or manufacturing requirements, in at least one embodiment. In some embodiments, all patterns in the M0 layer belong to the same mask. The M0A patterns include word line patterns, and the M0B patterns include source line and bit line patterns.

Specifically, the M0A patterns include program word line patterns WLP0_1, WLP0_2, WLP0_3 all corresponding to the program word line WLP0, and program word line patterns WLP1_1, WLP1_2 all corresponding to the program word line WLP1. The program word line patterns WLP0_1, WLP0_2, WLP0_3 are over and coupled to the gate region PO2 by the corresponding vias VG1, VG5, VG9. The program word line patterns WLP1_1, WLP1_2 are over and coupled to the gate region PO5 by the corresponding vias VG4, VG8. The M0A patterns further include read word line patterns WLR0_1, WLR0_2 all corresponding to the read word line WLR0, and read word line patterns WLR1_1, WLR1_2, WLR1_3 all corresponding to the read word line WLR1. The read word line patterns WLR0_1, WLR0_2, are over and coupled to the gate region PO3 by the corresponding vias VG3, VG7. The read word line patterns WLR1_1, WLR1_2, WLR1_3 are over and coupled to the gate region PO4 by the corresponding vias VG2, VG6, VG10.

The M0B patterns include source line patterns SL0_1, SL0_2 corresponding to the source line SL0, source line patterns SL1_1, SL1_2 corresponding to the source line SL1, source line patterns SL2_1, SL2_2 corresponding to the source line SL2, and source line patterns SL3_1, SL3_2 corresponding to the source line SL3. The M0B patterns include bit line patterns BL0_1, BL1_1, BL2_1, BL3_1 corresponding to the bit lines BL0, BL1, BL2, BL3. The source line patterns SL0_1, SL0_2 and the bit line pattern BL0_1 are over and coupled to the corresponding source/drain regions in the active region OD1 by the corresponding vias VD1, VD3, VD2. The source line patterns SL1_1, SL_2 and the bit line pattern BL1_1 are over and coupled to the corresponding source/drain regions in the active region OD2 by the corresponding vias VD4, VD6, VD5. The source line patterns SL2_1, SL2_2 and the bit line pattern BL2_1 are over and coupled to the corresponding source/drain regions in the active region OD2 by the corresponding vias VD7, VD9, VD8. The source line patterns SL3_1, SL3_2 and the bit line pattern BL3_1 are over and coupled to the corresponding source/drain regions in the active region OD1 by the corresponding vias VD10, VD12, VD11.

Each of the program word line patterns WLP0_1, WLP0_2, WLP0_3, WLP1_1, WLP1_2 has a width w1 in the Y direction greater than a width w2 of each of the read word line patterns WLR0_1, WLR0_2, WLR1_1, WLR1_2, WLR1_3 in the Y direction. A reason is that with a greater width w1, resistances of the program word line patterns are reduced which, in turn, increases the read current and improves the read operation. In at least one embodiment, the width w1 of the program word line patterns is the same as the width w2 of the read word line patterns.

Each of the source line patterns SL0_1, SL0_2, SL1_1, SL1_2, SL2_1, SL2_2, SL3_1, SL3_2 has a width w3 in the Y direction greater than the width w1 of each of the program word line patterns WLP0_1, WLP0_2, WLP0_3, WLP1_1, WLP1_2 in the Y direction. A reason is that the program voltage, e.g., 5V, applied to the source line patterns is greater than voltages, e.g., 1.5V or 1.8V, applied to the program word line patterns. With a greater width w3, resistances of the source line patterns are reduced which, in turn, reduces voltage drops on the source line patterns to ensure that a sufficient voltage for programming is applied to a gate dielectric to be broken down. As a result, a reliable programming operation is achievable. In at least one embodiment, the width w3 of the source line patterns is the same as the width w1 of the program word line patterns.

The source line patterns SL0_1, SL0_2, SL1_1, SL1_2, SL2_1, SL2_2, SL3_1, SL3_2, program word line patterns WLP0_1, WLP0_2, WLP0_3, WLP1_1, WLP1_2, and read word line patterns WLR0_1, WLR0_2, WLR1_1, WLR1_2, WLR1_3 are elongated in the X direction, i.e., each of the source line patterns, program word line patterns and read word line patterns has a greater dimension in the X direction than in the Y direction. The bit line patterns BL0_1, BL1_1, BL2_1, BL3_1 are elongated in the Y direction, i.e., each of the bit line patterns has a greater dimension in the Y direction than in the X direction. Other configurations are within the scopes of various embodiments.

In a memory cell, the source line pattern and the bit line pattern are arranged, in the Y direction, between the program word line pattern and the read word line pattern. For example, in the memory cell Bit 0, the source line pattern SL0_1 and the bit line pattern BL0_1 are arranged, in the Y direction, between the corresponding program word line pattern WLP0_1 and read word line pattern WLR0_1. The program word line pattern WLP0_1 and read word line pattern WLR0_1 are arranged on the boundary of the memory cell Bit 0, as illustrated in FIG. 5A. Other configurations are within the scopes of various embodiments. For example, in at least one embodiment, the source line pattern SL0_1 and the bit line pattern BL0_1 are arranged on the boundary of the memory cell Bit 0, and the program word line pattern WLP0_1 and read word line pattern WLR0_1 are arranged, in the Y direction, between the source line pattern SL0_1 and the bit line pattern BL0_1.

The program word line pattern and the read word line pattern of a memory cell correspondingly overlap, in the X direction, the read word line pattern and the program word line pattern of an abutting memory cell. For example, the program word line pattern WLP0_1 of the memory cell Bit 0 overlaps, in the X direction, the read word line pattern WLR1_1 of the memory cell Bit 1 which abuts the memory cell Bit 0 in the X direction. In at least one embodiment, a center line of the program word line pattern WLP0_1 coincides with a center line of the read word line pattern WLR1_1. Similarly, the read word line pattern WLR0_1 of the memory cell Bit 0 overlaps, in the X direction, the program word line pattern WLP1_1 of the abutting memory cell Bit 1. In at least one embodiment, a center line of the read word line pattern WLR0_1 coincides with a center line of the program word line pattern WLP1_1.

Over the same active region, a bit line pattern is arranged, in the X direction, between source line patterns. For example, over the active region OD1, the bit line pattern BL0_1 is arranged, in the X direction, between source line patterns SL0_1, SL0_2 which correspond to the same source line SL0. Other configurations are within the scopes of various embodiments. For example, in an alternative configuration in accordance with some embodiments, the pattern BL0_1 in FIG. 5A are configured as a source line pattern, and the patterns SL0_1, SL0_2 in FIG. 5A are configured as bit line patterns which correspond to the same bit line BL0. In such alternative configuration, over the active region OD1, a source line pattern is arranged, in the X direction, between bit line patterns. Further, in the alternative configuration, the patterns WLP0_1 and WLP1_1 are configured as read word line patterns, and the patterns WLR0_1 and WLR1_1 are configured as program word line patterns.

In some embodiments, at least at the device level illustrated in FIG. 5A, the memory cells Bit 0, Bit 1, . . . Bit 7 have symmetric configurations with respect to each other. For example, the patterns and/or regions in various layers in the memory cell Bit 2 are symmetric across the X direction to the corresponding patterns and/or regions in the corresponding layers in the memory cell Bit 0. In other words, the memory cell Bit 2 is obtainable by flipping the memory cell Bit 0 across the X direction. The memory cell Bit 3 is obtainable by flipping the memory cell Bit 0 across the Y direction. The memory cell Bit 1 is obtainable by flipping the memory cell Bit 3 across the X direction. The memory cell Bit 4 is identical to the memory cell Bit 0, the memory cell Bit 5 is identical to the memory cell Bit 1, the memory cell Bit 6 is identical to the memory cell Bit 2, and the memory cell Bit 7 is identical to the memory cell Bit 3.

FIG. 5B is a schematic view 500B at the M2 layer of the IC layout diagram 500.

The schematic view 500B also shows the active regions OD1, OD2, OD3, OD4, and the gate regions PO1, PO2 . . . PO6 and the dummy gate regions DPO1, DPO2. For simplicity, the gate regions and dummy gate regions are schematically illustrated in FIG. 5B by the corresponding center lines, also referred to as "gate tracks." The M2 layer comprises various patterns coupled to corresponding patterns in the M0 layer through corresponding vias in the VIA0 layer, corresponding patterns in the M1 layer, and corresponding vias in the VIA1 layer. For simplicity, the VIA0 layer, the M1 layer, and the VIA1 layer are omitted.

In FIG. 5B, various patterns in the M2 layer are schematically labeled as "M2A" and "M2B." In at least one embodiment, M2A patterns correspond to one mask and M2B patterns correspond to another mask. The separation of the patterns in the M2 layer into several masks is to meet one or more design and/or manufacturing requirements, in at least one embodiment. In some embodiments, all patterns in the M2 layer belong to the same mask. The M2A patterns include and bit lines and word line patterns, and the M2B patterns include source lines and further word line patterns.

Specifically, the M2A patterns include bit lines BL0, BL1, BL2, BL3 which extend continuously in the X direction across multiple memory cells. In at least one embodiment, the bit lines BL0, BL1, BL2, BL3 in the M2 layer extend continuously in the X direction across an entire memory array in the IC layout diagram 500. The M2A patterns further include program word line patterns WLP0_4, WLP0_5, WLP0_6 all corresponding to the program word line WLP0, and read word line patterns WLR1_4, WLR1_5, WLR1_6 all corresponding to the read word line WLR1.

The M2B patterns include source lines SL0, SL1, SL2, SL3 which extend continuously in the X direction across multiple memory cells. In at least one embodiment, the source lines SL0, SL1, SL2, SL3 in the M2 layer extend continuously in the X direction across an entire memory array in the IC layout diagram 500. The M2B patterns further include program word line patterns WLP1_3, WLP1_4 all corresponding to the program word line WLP1, and read word line patterns WLR0_3, WLR0_4 all corresponding to the read word line WLR0.

FIG. 5C is a schematic view 500C at the M3 layer of the IC layout diagram 500.

The schematic view 500C also shows the active regions OD1, OD2, OD3, OD4, and the gate regions PO1, PO2 . . . PO6 and the dummy gate regions DPO1, DPO2 as gate tracks. The M3 layer comprises various patterns coupled to corresponding patterns in the M2 layer through corresponding vias in the VIA2 layer, which is omitted for simplicity.

The M3 layer comprises program word lines WLP0, WLP1 and read word lines WLR0, WLR1, all of which extend continuously in the Y direction across multiple memory cells. In at least one embodiment, the program word lines WLP0, WLP1 and read word lines WLR0, WLR1 in the M3 layer extend continuously in the Y direction across an entire memory array in the IC layout diagram 500. The M3 layer further comprises various patterns 531-534 for coupling other circuit elements.

In the example configuration in FIGS. 5B-5C, the bit lines and source lines are arranged in the M2 layer as conductive tracks elongated in the X direction, whereas the program word lines and read word lines are arranged in a different, M3 layer as conductive tracks elongated in a different, Y direction. Other configurations are within the scopes of various embodiments. For example, in some embodiments, the bit lines and source lines are arranged in the M3 layer and the program word lines and read word lines are arranged in the M2 layer. In another example, the bit lines and source lines are arranged in more than one metal layer, and/or arranged in a metal layer other than the M2 layer and the M3 layer. In a further example, the program word lines and read word lines are arranged in more than one metal layer, and/or arranged in a metal layer other than the M2 layer and the M3 layer. In at least one embodiment, one or more advantages described herein are achievable in a memory device corresponding to the IC layout diagram 500.

Figure 6A:
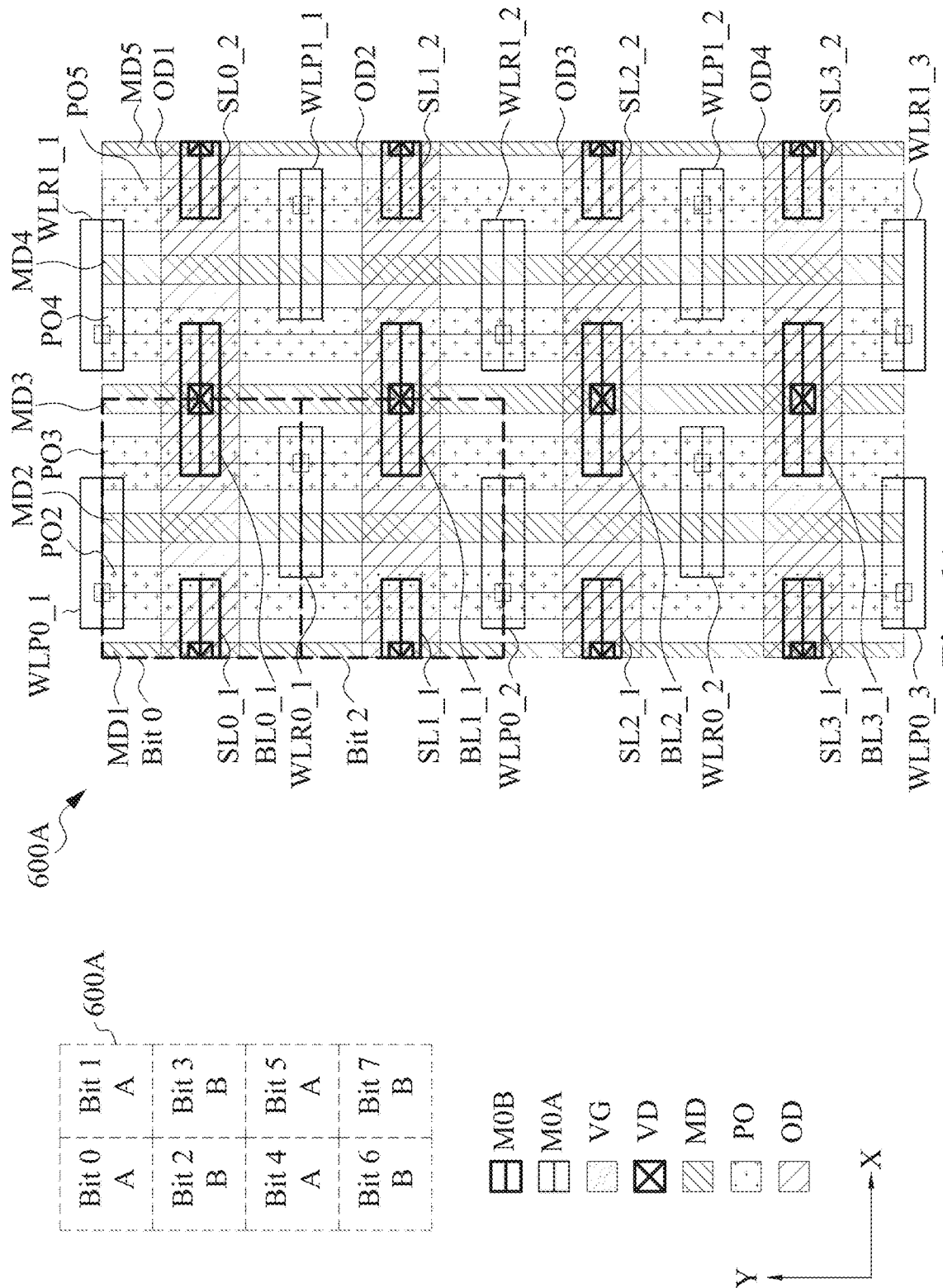
FIG. 6A is a schematic view of an IC layout diagram of a memory device, in accordance with some embodiments.

FIG. 6A is a schematic view of an IC layout diagram 600A of a memory device, in accordance with some embodiments. In at least one embodiment, the IC layout diagram 600A corresponds to an IC layout diagram of the memory device 300. The schematic view in FIG. 6A is at a device level of the IC layout diagram 600A, similarly to the schematic view 500A in FIG. 5A. Corresponding components of the IC layout diagram 600A and the IC layout diagram 500 are designated in FIG. 6A by the same reference numerals as in FIG. 5A. Differences between the IC layout diagram 500 and the IC layout diagram 600A are described herein.

The IC layout diagram 600A omits the gate regions PO1, PO6 and the dummy gate regions DPO1, DPO2 of the IC layout diagram 500.

The active regions OD1, OD2, OD3, OD4 extend in the X direction across multiple memory cells. For example, the active region OD1 extends continuously in the X direction across the memory cells Bit 0 and Bit 1, resulting in a continuous active region configuration. Other active region configurations are within the scopes of various embodiments.

MD regions MD1-MD5 are shown in FIG. 6A and are arranged alternatingly with the gate regions PO2-PO5 in the X direction. The region MD1 overlaps and is configured to couple the source line patterns SL0_1, SL1_1, SL2_1, SL3_1 to the corresponding source/drain regions of the corresponding program transistors of the corresponding memory cells Bit 0, Bit 2, Bit 4, Bit 6 in the corresponding active regions OD1, OD2, OD3, OD4. The region MD3 overlaps and is configured to couple the bit line patterns BL0_1, BL1_1, BL2_1, BL3_1 to the corresponding source/drain regions in the corresponding active regions OD1, OD2, OD3, OD4. The region MD5 overlaps and is configured to couple the source line patterns SL0_2, SL1_2, SL2_2, SL3_2 to the corresponding source/drain regions of the corresponding program transistors of the corresponding memory cells Bit 1, Bit 3, Bit 5, Bit 7 in the corresponding active region OD1, OD2, OD3, OD4. In some embodiments, the IC layout diagram 600A further comprises cut-MD regions (not shown in FIG. 6A) extending in the X direction across the regions MD1, MD3, MD5, to electrically isolate various portions of each of the regions MD1, MD3, MD5 in the corresponding memory cells from each other. The regions MD1, MD3, MD5, are arranged along the boundaries of the memory cells Bit 0, Bit 1, . . . Bit 7. The regions MD2, MD4 are not configured for electrically coupling the underlying source/drain regions to other circuit elements.

In some embodiments, the source line patterns, bit line patterns, program word line patterns, and read word line patterns of the IC layout diagram 600A are coupled to corresponding source lines, bit lines, program word lines, and read word lines in other metal layers, as described with respect to FIGS. 5B-5C.

Figure 6B:
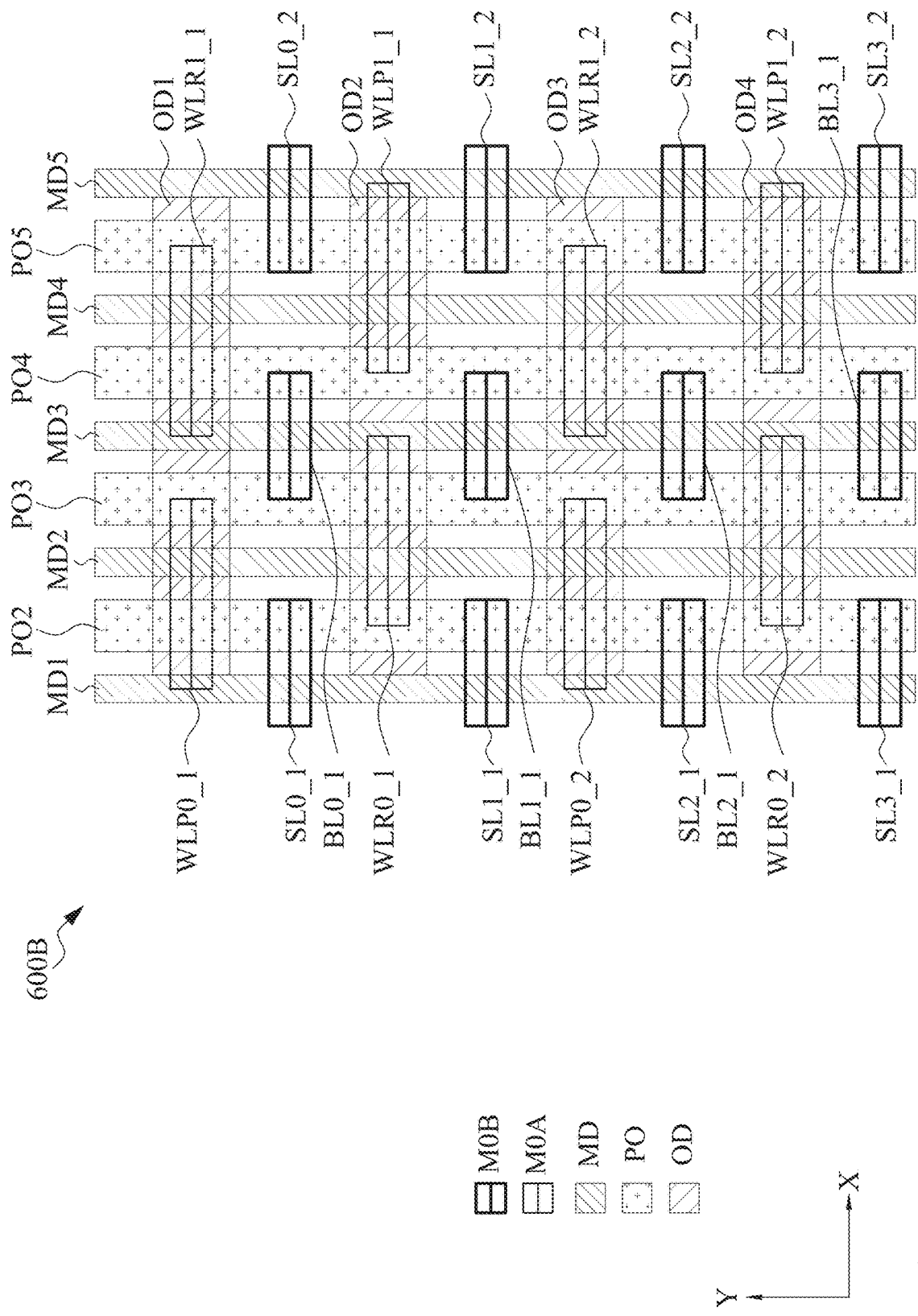
FIG. 6B is a schematic view of an IC layout diagram of a memory device, in accordance with some embodiments.

FIG. 6B is a schematic view of an IC layout diagram 600B of a memory device, in accordance with some embodiments. In at least one embodiment, the IC layout diagram 600B corresponds to an IC layout diagram of the memory device 300. The schematic view in FIG. 6B is at a device level of the IC layout diagram 600B, similarly to the schematic view 500A in FIG. 5A. Corresponding components of the IC layout diagram 600B and the IC layout diagram 600A are designated in FIG. 6B by the same reference numerals as in FIG. 6A. Differences between the IC layout diagram 600B and the IC layout diagram 600A are described herein.

In the IC layout diagram 600B in FIG. 6B, the program word line patterns WLP0_1, WLP0_2, WLP1_1, WLP1_2 and the read word line patterns WLR0_1, WLR0_2, WLR1_1, WLR1_2 are arranged over the corresponding active regions OD1, OD2, OD3, OD4. This is different from the IC layout diagram 600A in FIG. 6A, where the source line patterns SL0_1, SL0_2, SL1_1, SL1_2, SL2_1, SL2_2, SL3_1, SL3_2 and the bit line patterns BL0_1, BL1_1, BL2_1, BL3_1 are arranged over the corresponding active regions OD1, OD2, OD3, OD4.

In at least one embodiment, the gate length of each of the gate regions PO2-PO5 in the IC layout diagram 600A or 600B is about 55 nm. Although the gate length in an example of the IC layout diagram 600A or 600B is greater than the gate length in an example of the IC layout diagram 500, the omission of various features such as dummy gate regions from the IC layout diagram 600A or 600B, in some embodiments, results in a reduction of about 20% in the chip area. Other effects of the IC layout diagram 600A or 600B in one or more embodiments include lower resistance to the program current and/or the read current. In at least one embodiment, one or more advantages described herein are achievable in a memory device corresponding to the IC layout diagram 600A or 600B.

Returning to FIG. 6A, the IC layout diagram 600A includes a configuration A and a configuration B for memory cells. For example, the memory cells Bit 0, Bit 1, Bit 4, Bit 5 have the configuration A, whereas the memory cells Bit 2, Bit 3, Bit 6, Bit 7 have the configuration B. The patterns and/or regions in various layers in the configuration B are symmetric across the X direction to the corresponding patterns and/or regions in the corresponding layers in the configuration A. In other words, the configuration B is obtainable by flipping the configuration A across the X direction.

Figure 7A:
FIGS. 7A-7C are various layouts of memory cells in memory devices, in accordance with some embodiments.
Figure 7A:
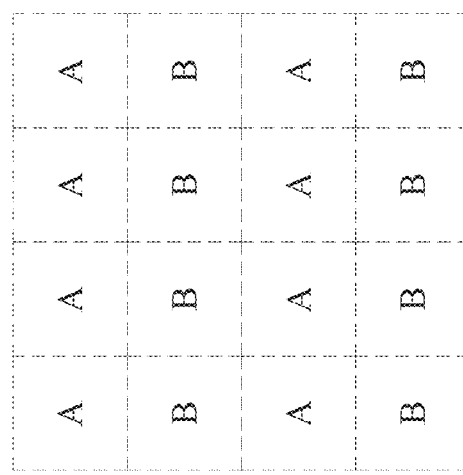
Figure 7A:
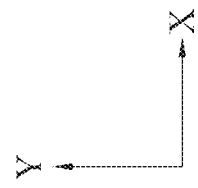
Figure 7B:
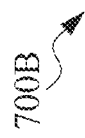
Figure 7B:
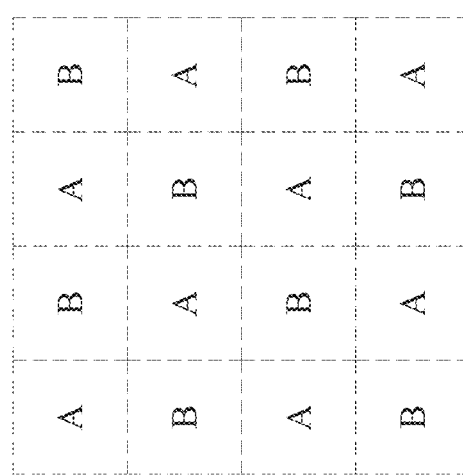
Figure 7B:
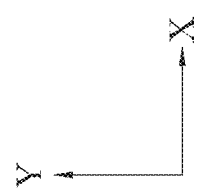
Figure 7C:
Figure 7C:
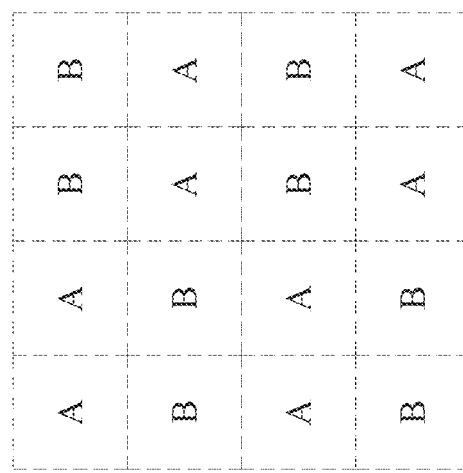
Figure 7C:
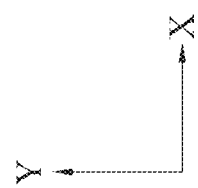

In the IC layout diagram 600A, the memory cells Bit 0, Bit 2, Bit 4, Bit 6 abutting each other in the Y direction have alternating configurations "ABAB." Similarly, the memory cells Bit 1, Bit 3, Bit 5, Bit 7 abutting each other in the Y direction also have the alternating configurations "ABAB." In some embodiments, provided that memory cells abutting each other in the Y direction have alternating configurations, e.g., "ABAB," as described herein, there are various possible patterns of configurations A and/or B for memory cells abutting each other in the X direction, for example, as described with respect to FIGS. 7A-7C.

FIGS. 7A-7C are various layouts 700A-700C of memory cells in memory devices, in accordance with some embodiments.

In each of the layouts 700A-700C, various memory cells having the configuration A and the configuration B are arranged in abutment with each other in a repeating pattern. The layouts 700A-700C include a common arrangement in the Y direction in which abutting memory cells have the alternating configurations "ABAB." However, in the X direction, the layouts 700A-700C include different arrangements, for example, "AAAA" and "BBBB" in the layout 700A in FIG. 7A, "ABAB" and "BABA" in the layout 700B in FIG. 7B, "AABB" and "BBAA" in the layout 700C in FIG. 7C. The layouts 700A-700C are examples. Other layouts of memory cells are within the scopes of various embodiments. In at least one embodiment, one or more advantages described herein are achievable in a memory device corresponding to each of the layouts 700A-700C.

Figure 8:
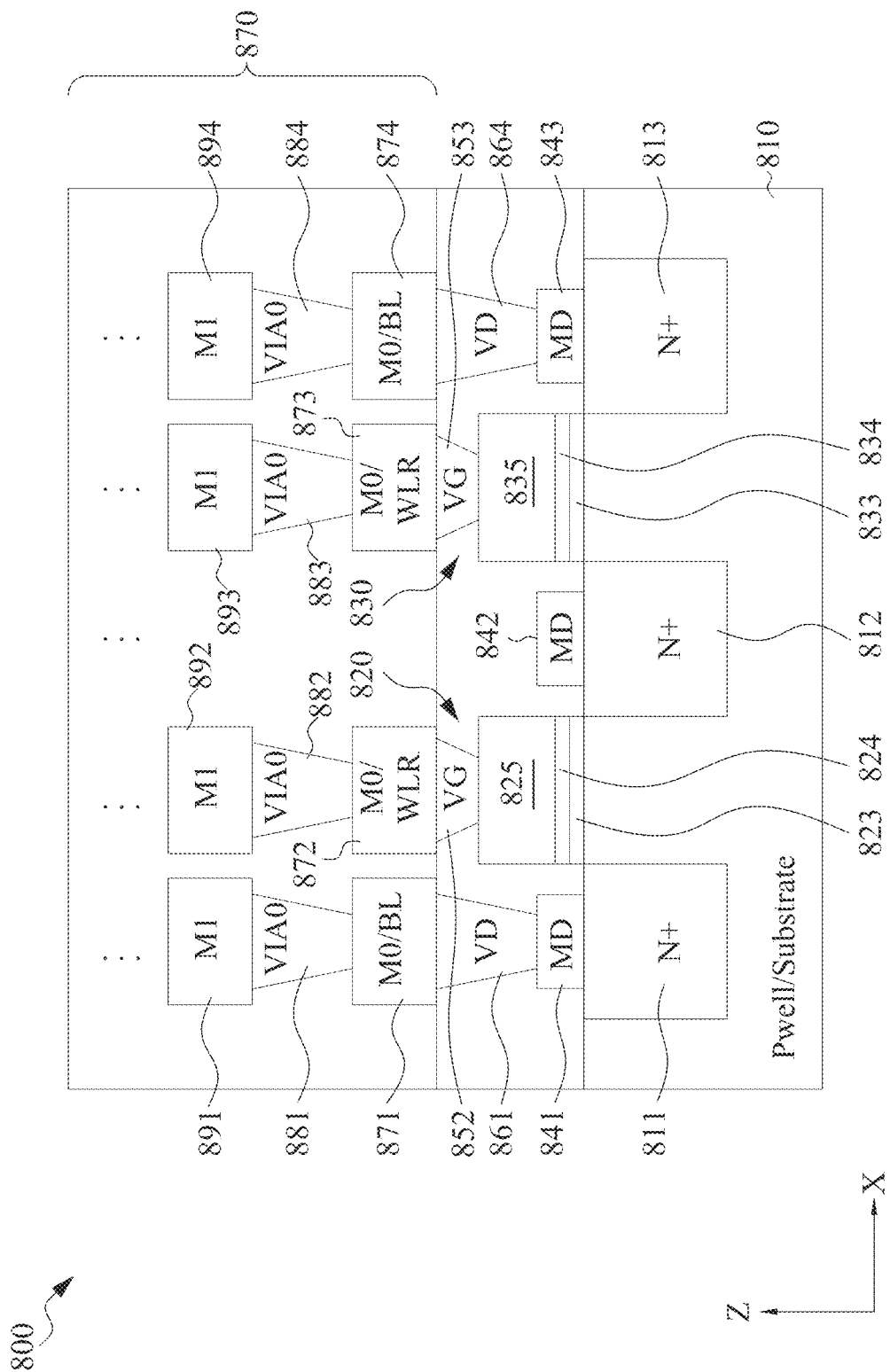
FIG. 8 is a schematic cross-sectional view of an IC device, in accordance with some embodiments.

FIG. 8 is a schematic cross-sectional view of an IC device 800, in accordance with some embodiments. In at least one embodiment, the IC device 800 corresponds to one or more of the memory devices and/or IC layout diagrams described herein.

The IC device 800 comprises a substrate 810, and a program transistor 820 and a read transistor 830 over the substrate 810. In at least one embodiment, the program transistor 820 corresponds to one or more of the program transistors described with respect to FIGS. 2, 5A, 6A, 6B and the read transistor 830 corresponds to one or more of the corresponding read transistors described with respect to FIGS. 2, 5A, 6A, 6B.

In some embodiments, the substrate 810 is a semiconductor substrate. N-type and P-type dopants are added to the substrate to correspondingly form N wells 811, 812, 813, and P wells (not shown). In some embodiments, isolation structures are formed between adjacent P wells and N wells. For simplicity, several features such as P wells and isolation structures are omitted from FIG. 8.

Each of the program transistor 820 and read transistor 830 comprises a gate region and source/drain regions. The N wells 811, 812 define the source/drain regions of the program transistor 820. The N wells 812, 813 define the source/drain regions of the read transistor 830. The source/drain region 812 is a common source/drain region of the program transistor 820 and read transistor 830. The gate region of the program transistor 820 comprises a stack of gate dielectric layers 823, 824, and a gate electrode 825. In a programming operation, the gate dielectric layers 823, 824 are configured to be broken down by a predetermined breakdown voltage applied across the gate dielectric layers 823, 824 from a source line coupled to the source/drain region 811 to a program word line coupled to the gate electrode 825. The gate region of the read transistor 830 comprises a stack of gate dielectric layers 833, 834, and a gate electrode 835. In at least one embodiment, each of the program transistor 820 and the read transistor 830 comprises a gate dielectric layer instead of multiple gate dielectrics. Example materials of the gate dielectric layer or layers include $HfO_2$, $ZrO_2$, or the like. Example materials of the gate electrodes 825, 835 include polysilicon, metal, or the like.

The IC device 800 further comprises contact structures. The contact structures comprise MD regions 841, 842, 843 correspondingly over and in electrical contact with the source/drain regions 811, 812, 813. The MD regions 841, 843 are configured to electrically couple the underlying source/drain regions 811, 813 to other circuitry. The MD region 842 is not configured for electrically coupling the underlying source/drain region 812 to other circuit elements, for example, as described with respect to the regions MD2, MD4 in FIG. 6A.

The contact structures further comprise various vias. For example, VG vias 852, 853 are correspondingly over and in electrical contact with the gate electrodes 825, 835, and are configured to couple the gate electrodes 825, 835, to corresponding program word line and read word line, as described herein. VD vias 861, 864 are correspondingly over and in electrical contact with the MD regions 841, 843. The VD via 861 is configured to couple the source/drain regions 811 of the program transistor 820 to a source line, as described herein. The VD via 864 is configured to couple the source/drain region 813 of the read transistor 830 to a bit line, as described herein.

The IC device 800 further comprises an interconnect structure 870. The interconnect structure 870 comprises a plurality of metal layers M0, M1, or the like, and a plurality of via layers VIA0, VIA1, or the like, arranged alternatingly in a thickness direction, i.e., the Z direction, of the substrate 810. The interconnect structure 870 further comprises various interlayer dielectric (ILD) layers (not numbered) in which the metal layers and via layers are embedded. The metal layers and via layers of the interconnect structure 870 are configured to electrically couple various elements or circuits of the IC device 800 with each other, and with external circuitry. The M0 layer, M1 layer and VIA0 layer of the interconnect structure 870 are illustrated in FIG. 8. Other metal layers and via layers are omitted for simplicity.

In the example configuration in FIG. 8, the M0 layer comprises M0 patterns 871-874 correspondingly over and in electrical contact with the vias 861, 852, 853, 864. The M0 patterns 871-874 correspond to a source line pattern, a program word line pattern, a read word line pattern, and a bit line pattern, as described herein. The M0 patterns 871-874 are electrically coupled through corresponding vias 881-884 in the VIA0 layer to corresponding M1 patterns 891-894 in the M1 layer. Further via layers and/or metal layers of the interconnect structure 870 electrically couple the M1 patterns 891-894 to the corresponding source line, program word line, read word line and bit line, as described herein. In at least one embodiment, one or more advantages described herein are achievable in the IC device 800.

Figure 9:
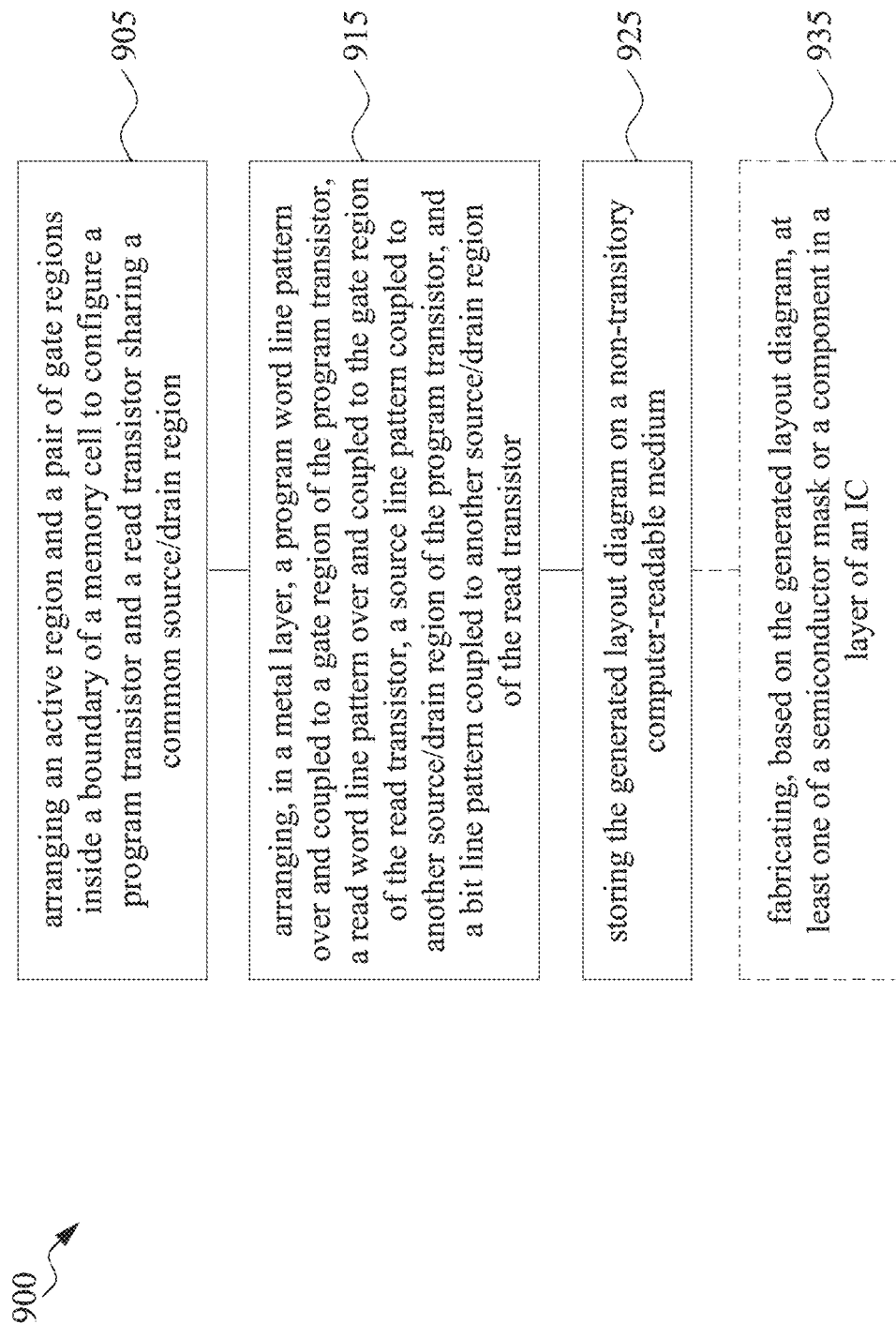
FIG. 9 is a flow chart of a method, in accordance with some embodiments.

FIG. 9 is a flow chart of a method 900, in accordance with some embodiments. In at least one embodiment, the method 900 is for one or more of generating a layout diagram for a memory cell, or building a standard cell library including one or more memory cells.

In some embodiments, one or more operations of the method 900 are performed as part of a method of forming one or more memory devices and/or IC devices described herein. In some embodiments, one or more operations of the method 900 are performed as part of an automated placement and routing (APR) method. In some embodiments, one or more operations of the method 900 are performed by an APR system, e.g., a system included in an EDA system described with respect to FIG. 12. In some embodiments, one or more operations of the method 900 are performed as part of a method 1000 described with respect to FIG. 10, for generating a layout diagram of an IC device. In some embodiments, one or more operations of the method 900 are performed as part of a design procedure performed in a design house described with respect to FIG. 13. In some embodiments, one or more operations of the method 900 are executed by a processor, such as a processor of an EDA system described with respect to FIG. 12. In some embodiments, one or more operations in the method 900 described herein are omitted.

At operation 905, an active region and a pair of gate regions are arranged inside a boundary of a memory cell to configure a program transistor and a read transistor sharing a common source/drain region. For example, as described herein with respect to FIGS. 5A and 6A, an active region OD1 and a pair of gate regions PO2, PO3 are arranged inside a boundary of a memory cell Bit 0, to configure a program transistor and a read transistor which share a common source/drain region 512, as described with respect to FIG. 5A. In at least one embodiment, the program transistor and read transistor correspond to the transistors TP and TR described with respect to FIG. 2, and/or the transistors TP0 and TR0 described with respect to FIGS. 3A-3B.

At operation 915, several patterns are arranged in a metal layer. The patterns include a program word line pattern over and coupled to a gate region of the program transistor, a read word line pattern over and coupled to the gate region of the read transistor, a source line pattern coupled to another source/drain region of the program transistor, and a bit line pattern coupled to another source/drain region of the read transistor. For example, a program word line pattern WLP0_1, a read word line pattern WLR0_1, a source line pattern SL0_1, and a bit line pattern BL0_1 are arranged in a M0 layer, as described with respect to FIGS. 5A and 6A. The program word line pattern WLP0_1 is over and coupled to the gate region PO2 of the program transistor. The read word line pattern WLR0_1 is over and coupled to the gate region PO3 of the read transistor. The source line pattern SL0_1 is coupled to another source/drain region 511 of the program transistor. The bit line pattern BL0_1 is coupled to another source/drain region 513 of the read transistor. As a result, a layout diagram of the memory cell is generated.

At operation 925, the generated layout diagram of the memory cell is stored in a standard cell library on a non-transitory computer-readable medium. In some embodiments, various memory cells having different configurations are generated and stored in the standard cell library. In an example, symmetrical layout diagrams of one or more of memory cells Bit 0, Bit 1, Bit 2, Bit 3 described with respect to FIG. 5A are generated and stored in the standard cell library. In another example, configuration A and configuration B for various memory cells, as described with respect to FIG. 6A, are generated and stored in the standard cell library.

Figure 13:
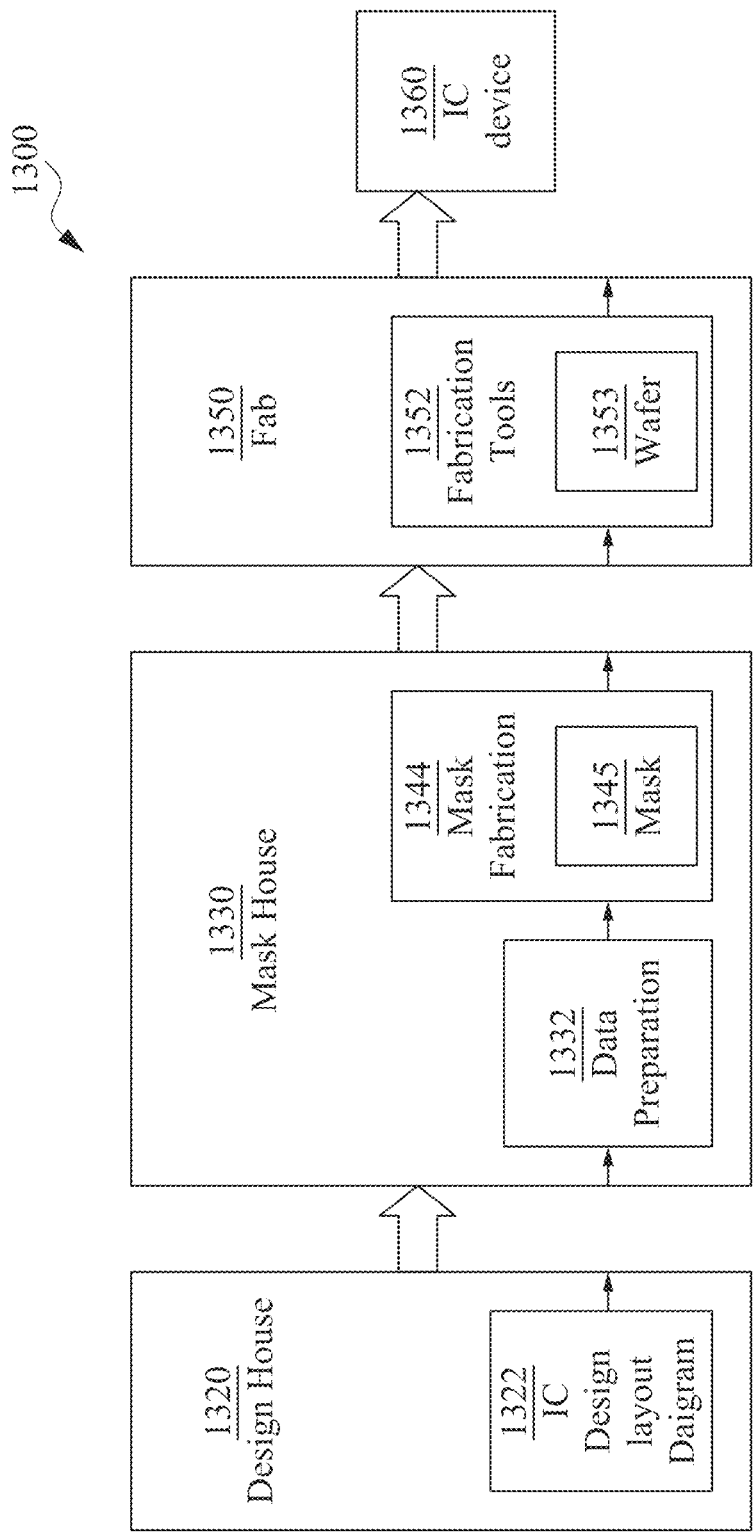
FIG. 13 is a block diagram of an IC manufacturing system and an IC manufacturing flow associated therewith, in accordance with some embodiments.

At operation 935, based on the generated layout diagram, at least one of a semiconductor mask or a component in a layer of an IC device is fabricated, for example, as described with respect to FIG. 13. In at least one embodiment, operation 935 is omitted.

In at least one embodiment, all operations of the method 900 are automatically performed, e.g., by a processor as described herein, without user input or intervention.

Figure 10:
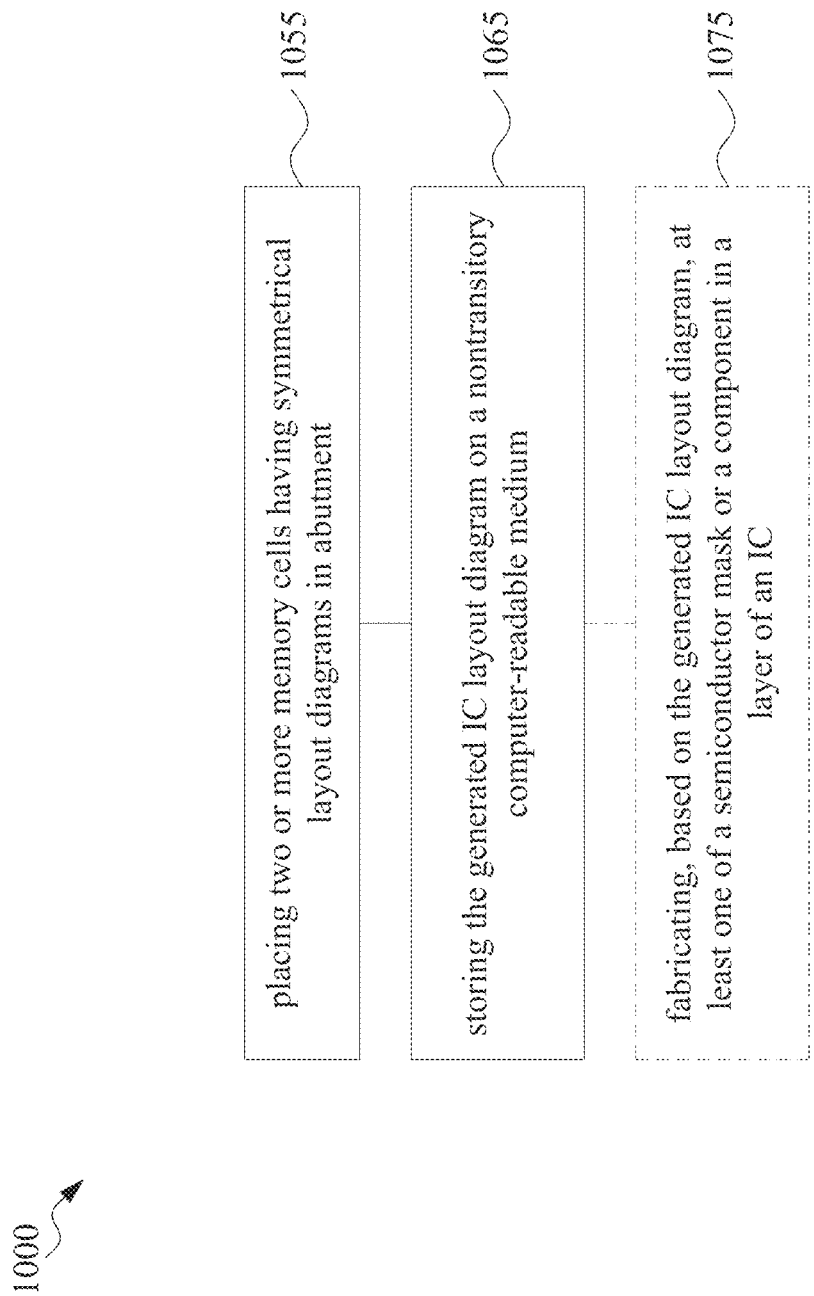
FIG. 10 is a flow chart of a method, in accordance with some embodiments.

FIG. 10 is a flow chart of a method 1000, in accordance with some embodiments. In at least one embodiment, the method 1000 is for generating an IC layout diagram of an IC device, based on cells received from a standard cell library.

In some embodiments, one or more operations of the method 1000 are performed as part of forming one or more memory devices and/or IC devices described herein. In some embodiments, one or more operations of the method 1000 are performed as part of an APR method. In some embodiments, one or more operations of the method 1000 are performed by an APR system, e.g., a system included in an EDA system described with respect to FIG. 12, and configured to perform the APR method. In some embodiments, one or more operations of the method 1000 are performed as part of a design procedure performed in a design house described with respect to FIG. 13. In some embodiments, one or more operations of the method 1000 are executed by a processor, such as a processor of an EDA system described with respect to FIG. 12.

At operation 1055, two or more memory cells having symmetrical layout diagrams are placed in abutment. In an example, memory cells Bit 0, Bit 1, Bit 2, Bit 3 described with respect to FIG. 5A are read from a standard cell library, and are placed in abutment in the X direction and the Y direction, and in a repeating pattern to obtain an IC layout diagram of an array of memory cells for a memory device.

In a further example, configuration A and configuration B for various memory cells, as described with respect to FIG. 6A, are read from a standard cell library, and are placed in abutment in the X direction and the Y direction, and in a repeating pattern to obtain an IC layout diagram of an array of memory cells for a memory device. Examples of various repeating patterns for arranging memory cells are described with respect to FIGS. 7A-7C.

At operation 1065, the generated IC layout diagram is stored on a non-transitory computer-readable medium. For example, the IC layout diagram 500, 600A, 600B is stored on a non-transitory computer-readable medium.

At operation 1075, based on the generated IC layout diagram, at least one of a semiconductor mask or a component in a layer of an IC is fabricated, for example, as described with respect to FIG. 13. In at least one embodiment, operation 1075 is omitted. In at least one embodiment, all operations of the method 1000 are automatically performed, e.g., by a processor as described herein, without user input or intervention.

In some embodiments, one or more cells, IC devices, and methods described are applicable to various types of transistor or device technologies including, but not limited to, planar transistor technology, FINFET technology, nanosheet FET technology, nanowire FET technology, or the like.

Figure 11:
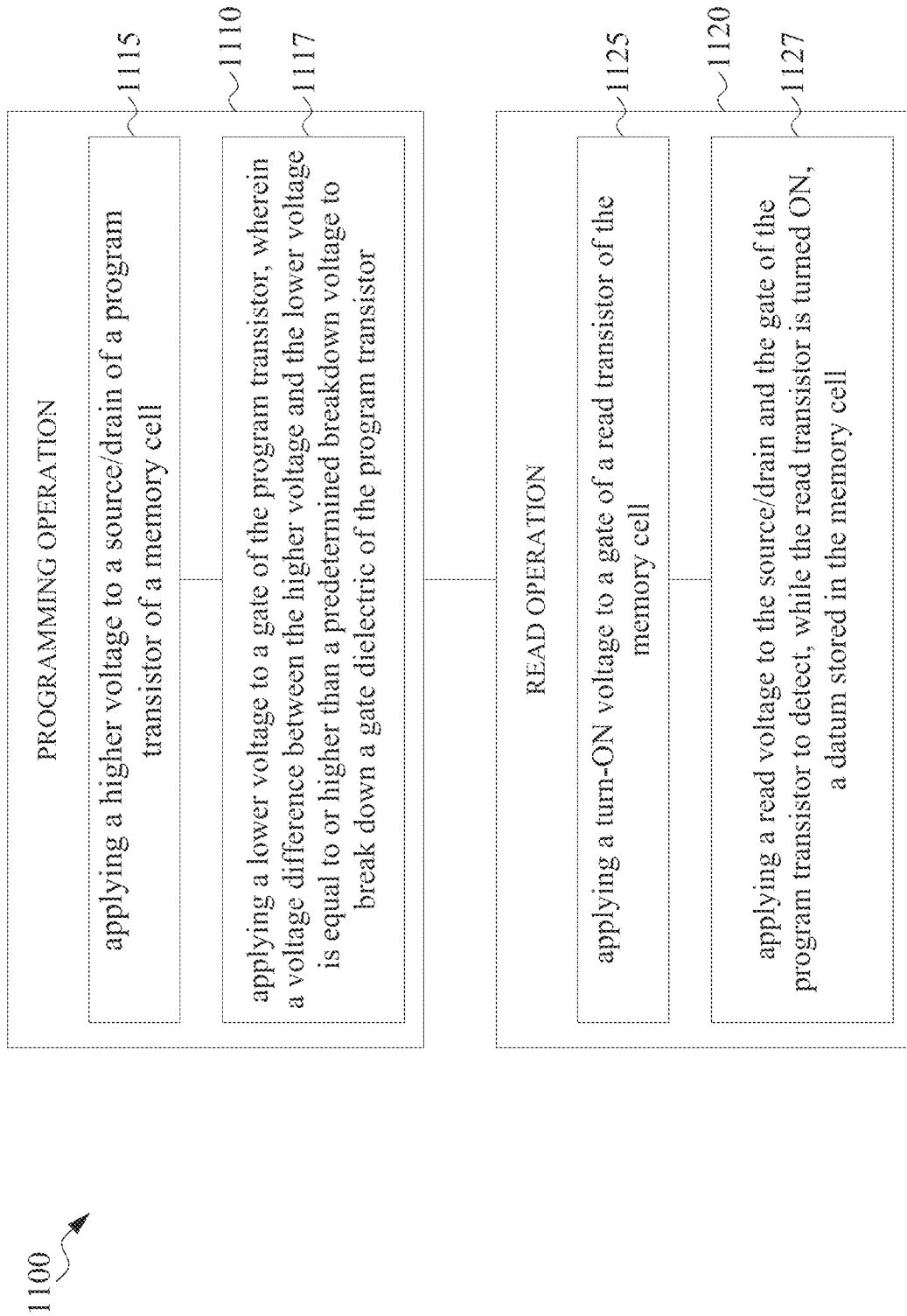
FIG. 11 is a flow chart of a method, in accordance with some embodiments.

FIG. 11 is a flow chart of a method 1100, in accordance with some embodiments. In at least one embodiment, the method 1100 is a method of operating a memory cell having a program transistor.

The method 1100 comprises a programming operation 1110, which comprises operation 1115 and operation 1117.

At operation 1115, a higher voltage is applied to a source/drain of the program transistor of a memory cell. In an example, a higher program voltage Vprog is applied via a source line SL to a first terminal 211, which is a source/drain, of the program transistor TP, as described with respect to FIG. 2. In a further example, the program voltage Vprog is applied via a source line SL0 to a source/drain of a program transistor TP0, as described with respect to FIG. 3A.

At operation 1117, a lower voltage is applied to a gate of the program transistor. A voltage difference between the higher voltage and the lower voltage is equal to or higher than a predetermined breakdown voltage to break down a gate dielectric of the program transistor. In an example, a reference voltage lower than the program voltage Vprog is applied via the program word line WLP to a gate terminal 210 of the program transistor TP, as described with respect to FIG. 2. In a further example, the reference voltage is applied via the program word line WLP0 to the gate terminal of a program transistor TP0, as described with respect to FIG. 3A. In at least one embodiment, the reference voltage is the ground voltage. Reference voltages other than the ground voltage are within the scopes of various embodiments, provided that the voltage difference between the higher program voltage Vprog and the lower reference voltage is equal to or higher than a predetermined breakdown voltage which is sufficient to break down a gate dielectric of the program transistor TP, TP0. The voltage difference causes the gate dielectric to break down and causes a programming current Iprog to flow from the source line SL through the program transistor TP to the program word line WLP, as described with respect to FIG. 2. In some embodiments, the memory cell further comprises a read transistor which is turned OFF during the programming operation, as described with respect to FIGS. 2 and 3A.

The method 1100 further comprises a read operation 1120, which comprises operation 1125 and operation 1127.

At operation 1125, a turn-ON voltage is applied to a gate of a read transistor of the memory cell. For example, a turn-ON voltage, such as a core voltage Vcore, is applied via the read word line WLR, WRL0 to a gate terminal of a read transistor TR, TR0, as described with respect to FIGS. 2 and 3B. As a result, the read transistor is turned ON.

At operation 1127, a read voltage is applied to the source/drain and the gate of the program transistor to detect, while the read transistor is turned ON, a datum stored in the memory cell. For example, a read voltage, e.g., Vread, is applied via the source line SL/SL0 to the source/drain and via the program word line WLP, WLP0 to the gate of the program transistor TP, TP0, while the read transistor TR, TR0 is turned ON, as described with respect to FIGS. 2 and 3B. As a result, a read current Tread flows from the program transistor TP, TP0 through the turned ON read transistor TR, TR0 to a corresponding bit line BL, BL0, as described with respect to FIG. 2. The bit line BL, BL0 is coupled to a sense amplifier which detects the read current Tread and, based on the detected read current Tread, determines the datum stored in the program transistor TP, TP0 of the memory cell. As described with respect to FIG. 2, the current paths of the programming current Iprog and the read current Tread are different from each other.

In at least one embodiment, because the high program voltage Vprog is applied to the source line instead of the program word line, one or more advantages including, but not limited to, reduced leakage current, improved device reliability, or the like, are achievable as described herein.

Figure 12:
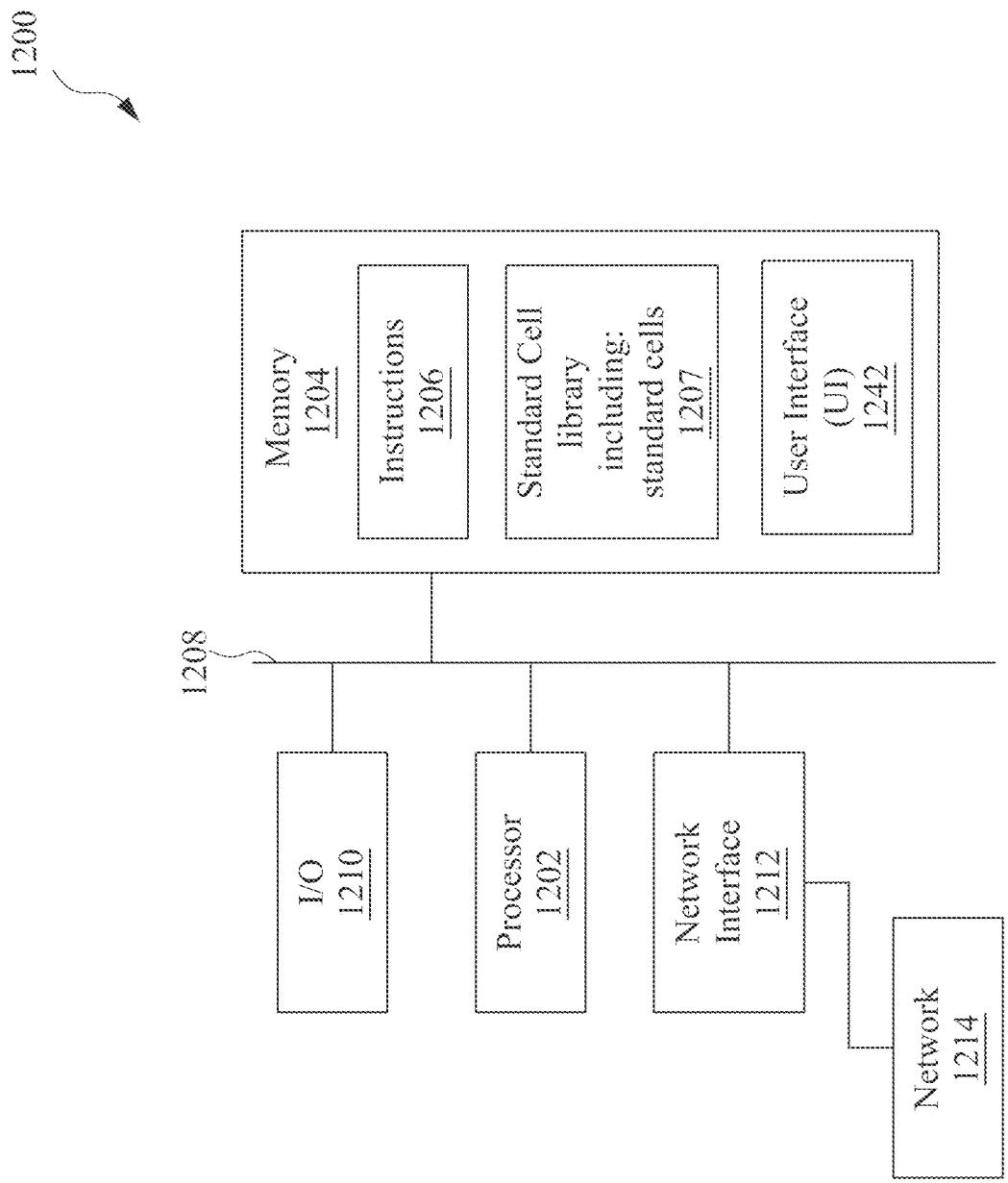
FIG. 12 is a block diagram of an EDA system, in accordance with some embodiments.

FIG. 12 is a block diagram of an electronic design automation (EDA) system 1200 in accordance with some embodiments.

In some embodiments, EDA system 1200 includes an APR system. Methods described herein of designing layout diagrams represent wire routing arrangements, in accordance with one or more embodiments, are implementable, for example, using EDA system 1200, in accordance with some embodiments.

In some embodiments, EDA system 1200 is a general purpose computing device including a hardware processor 1202 and a non-transitory, computer-readable storage medium 1204. Storage medium 1204, amongst other things, is encoded with, i.e., stores, computer program code 1206, i.e., a set of executable instructions. Execution of instructions 1206 by hardware processor 1202 represents (at least in part) an EDA tool which implements a portion or all of the methods described herein in accordance with one or more embodiments (hereinafter, the noted processes and/or methods).

Processor 1202 is electrically coupled to computer-readable storage medium 1204 via a bus 1208. Processor 1202 is also electrically coupled to an I/O interface 1210 by bus 1208. A network interface 1212 is also electrically connected to processor 1202 via bus 1208. Network interface 1212 is connected to a network 1214, so that processor 1202 and computer-readable storage medium 1204 are capable of connecting to external elements via network 1214. Processor 1202 is configured to execute computer program code 1206 encoded in computer-readable storage medium 1204 in order to cause system 1200 to be usable for performing a portion or all of the noted processes and/or methods. In one or more embodiments, processor 1202 is a central processing unit (CPU), a multi-processor, a distributed processing system, an application specific integrated circuit (ASIC), and/or a suitable processing unit.

In one or more embodiments, computer-readable storage medium 1204 is an electronic, magnetic, optical, electromagnetic, infrared, and/or a semiconductor system (or apparatus or device). For example, computer-readable storage medium 1204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1204 includes a compact disk-read only memory (CD-ROM), a compact disk-read/write (CD-R/W), and/or a digital video disc (DVD).

In one or more embodiments, storage medium 1204 stores computer program code 1206 configured to cause system 1200 (where such execution represents (at least in part) the EDA tool) to be usable for performing a portion or all of the noted processes and/or methods. In one or more embodiments, storage medium 1204 also stores information which facilitates performing a portion or all of the noted processes and/or methods. In one or more embodiments, storage medium 1204 stores library 1207 of standard cells including such standard cells as disclosed herein.

EDA system 1200 includes I/O interface 1210. I/O interface 1210 is coupled to external circuitry. In one or more embodiments, I/O interface 1210 includes a keyboard, keypad, mouse, trackball, trackpad, touchscreen, and/or cursor direction keys for communicating information and commands to processor 1202.

EDA system 1200 also includes network interface 1212 coupled to processor 1202. Network interface 1212 allows system 1200 to communicate with network 1214, to which one or more other computer systems are connected. Network interface 1212 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1200.

System 1200 is configured to receive information through I/O interface 1210. The information received through I/O interface 1210 includes one or more of instructions, data, design rules, libraries of standard cells, and/or other parameters for processing by processor 1202. The information is transferred to processor 1202 via bus 1208. EDA system 1200 is configured to receive information related to a UI through I/O interface 1210. The information is stored in computer-readable medium 1204 as user interface (UI) 1242.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1200. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

FIG. 13 is a block diagram of an integrated circuit (IC) manufacturing system 1300, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1300.

In FIG. 13, IC manufacturing system 1300 includes entities, such as a design house 1320, a mask house 1330, and an IC manufacturer/fabricator ("fab") 1350, that interact with one another in the design, development, and manufacturing cycles and/or services related to manufacturing an IC device 1360. The entities in system 1300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1320, mask house 1330, and IC fab 1350 is owned by a single larger company. In some embodiments, two or more of design house 1320, mask house 1330, and IC fab 1350 coexist in a common facility and use common resources.

Design house (or design team) 1320 generates an IC design layout diagram 1322. IC design layout diagram 1322 includes various geometrical patterns designed for an IC device 1360. The geometrical patterns correspond to patterns of metal, oxide, or semiconductor layers that make up the various components of IC device 1360 to be fabricated. The various layers combine to form various IC features. For example, a portion of IC design layout diagram 1322 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1320 implements a proper design procedure to form IC design layout diagram 1322. The design procedure includes one or more of logic design, physical design or place-and-route operation. IC design layout diagram 1322 is presented in one or more data files having information of the geometrical patterns. For example, IC design layout diagram 1322 can be expressed in a GDSII file format or DFII file format.

Mask house 1330 includes data preparation 1332 and mask fabrication 1344. Mask house 1330 uses IC design layout diagram 1322 to manufacture one or more masks 1345 to be used for fabricating the various layers of IC device 1360 according to IC design layout diagram 1322. Mask house 1330 performs mask data preparation 1332, where IC design layout diagram 1322 is translated into a representative data file ("RDF"). Mask data preparation 1332 provides the RDF to mask fabrication 1344. Mask fabrication 1344 includes a mask writer. A mask writer converts the RDF to an image on a substrate, such as a mask (reticle) 1345 or a semiconductor wafer 1353. The design layout diagram 1322 is manipulated by mask data preparation 1332 to comply with particular characteristics of the mask writer and/or requirements of IC fab 1350. In FIG. 13, mask data preparation 1332 and mask fabrication 1344 are illustrated as separate elements. In some embodiments, mask data preparation 1332 and mask fabrication 1344 can be collectively referred to as mask data preparation.

In some embodiments, mask data preparation 1332 includes optical proximity correction (OPC) which uses lithography enhancement techniques to compensate for image errors, such as those that can arise from diffraction, interference, other process effects and the like. OPC adjusts IC design layout diagram 1322. In some embodiments, mask data preparation 1332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1332 includes a mask rule checker (MRC) that checks the IC design layout diagram 1322 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1322 to compensate for limitations during mask fabrication 1344, which may undo part of the modifications performed by OPC in order to meet mask creation rules.

In some embodiments, mask data preparation 1332 includes lithography process checking (LPC) that simulates processing that will be implemented by IC fab 1350 to fabricate IC device 1360. LPC simulates this processing based on IC design layout diagram 1322 to create a simulated manufactured device, such as IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1322.

It should be understood that the above description of mask data preparation 1332 has been simplified for the purposes of clarity. In some embodiments, data preparation 1332 includes additional features such as a logic operation (LOP) to modify the IC design layout diagram 1322 according to manufacturing rules. Additionally, the processes applied to IC design layout diagram 1322 during data preparation 1332 may be executed in a variety of different orders.

After mask data preparation 1332 and during mask fabrication 1344, a mask 1345 or a group of masks 1345 are fabricated based on the modified IC design layout diagram 1322. In some embodiments, mask fabrication 1344 includes performing one or more lithographic exposures based on IC design layout diagram 1322. In some embodiments, an electron-beam (e-beam) or a mechanism of multiple e-beams is used to form a pattern on a mask (photomask or reticle) 1345 based on the modified IC design layout diagram 1322. Mask 1345 can be formed in various technologies. In some embodiments, mask 1345 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1345 includes a transparent substrate (e.g., fused quartz) and an opaque material (e.g., chromium) coated in the opaque regions of the binary mask. In another example, mask 1345 is formed using a phase shift technology. In a phase shift mask (PSM) version of mask 1345, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1344 is used in a variety of processes. For example, such a mask(s) is used in an ion implantation process to form various doped regions in semiconductor wafer 1353, in an etching process to form various etching regions in semiconductor wafer 1353, and/or in other suitable processes.

IC fab 1350 is an IC fabrication business that includes one or more manufacturing facilities for the fabrication of a variety of different IC products. In some embodiments, IC Fab 1350 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1350 includes fabrication tools 1352 configured to execute various manufacturing operations on semiconductor wafer 1353 such that IC device 1360 is fabricated in accordance with the mask(s), e.g., mask 1345. In various embodiments, fabrication tools 1352 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1350 uses mask(s) 1345 fabricated by mask house 1330 to fabricate IC device 1360. Thus, IC fab 1350 at least indirectly uses IC design layout diagram 1322 to fabricate IC device 1360. In some embodiments, semiconductor wafer 1353 is fabricated by IC fab 1350 using mask(s) 1345 to form IC device 1360. In some embodiments, the IC fabrication includes performing one or more lithographic exposures based at least indirectly on IC design layout diagram 1322. Semiconductor wafer 1353 includes a silicon substrate or other proper substrate having material layers formed thereon. Semiconductor wafer 1353 further includes one or more of various doped regions, dielectric features, multi-level interconnects, and the like (formed at subsequent manufacturing steps).

Details regarding an integrated circuit (IC) manufacturing system (e.g., system 1300 of FIG. 13), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an integrated circuit (IC) device comprises a first active region extending along a first direction, a first pair of gate regions extending across the first active region along a second direction transverse to the first direction, and a first metal layer. The first pair of gate regions and the first active region configure a first program transistor and a first read transistor sharing a common source/drain region. The first metal layer comprises a first program word line pattern over and coupled to the gate region of the first program transistor, a first read word line pattern over and coupled to the gate region of the first read transistor, a first source line pattern coupled to another source/drain region of the first program transistor, and a first bit line pattern coupled to another source/drain region of the first read transistor.

In some embodiments, an integrated circuit (IC) device comprises: a first active region extending along a first direction, first through fourth gate regions extending across the first active region along a second direction transverse to the first direction, and a first metal layer. The first through fourth gate regions and the first active region correspondingly configure first through fourth transistors. The first and second transistors share a first common source/drain region. The second and third transistors share a second common source/drain region. The third and fourth transistors share a third common source/drain region. The first metal layer comprises: first through fourth word line patterns over and correspondingly coupled to the first through fourth gate regions, a first source line pattern coupled to a source/drain region of the first transistor other than the first common source/drain region, a second source line pattern coupled to a source/drain region of the fourth transistor other than the third common source/drain region, and a first bit line pattern coupled to the second common source/drain region. The first source line pattern is coupled to the second source line pattern. The first bit line pattern is physically arranged, along the first direction, between the first source line pattern and the second source line pattern.

In some embodiments, an integrated circuit (IC) device comprises: a first active region extending along a first direction, a second active region extending along the first direction and spaced from the first active region along a second direction transverse to the first direction, first and second gate regions extending along the second direction and across the first and second active regions, and a first metal layer. The first and second gate regions correspondingly configure, together with the first active region, first and second transistors. The first and second transistors share a first common source/drain region. The first and second gate regions correspondingly configure, together with the second active region, third and fourth transistors. The third and fourth transistors share a second common source/drain region. The first metal layer comprises: a first word line pattern over and coupled to the first gate region, a second word line pattern over and coupled to the second gate region, a third word line pattern over and coupled to the first gate region, a first source line pattern coupled to a source/drain region of the first transistor other than the first common source/drain region, a second source line pattern coupled to a source/drain region of the third transistor other than the second common source/drain region, a first bit line pattern coupled to a source/drain region of the second transistor other than the first common source/drain region, and a second bit line pattern coupled to a source/drain region of the fourth transistor other than the second common source/drain region. The first source line pattern and the first bit line pattern are physically arranged, along the second direction, between the first word line pattern and the second word line pattern. The second source line pattern and the second bit line pattern are physically arranged, along the second direction, between the second word line pattern and the third word line pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
a first active region extending along a first direction;
a first pair of gate regions extending across the first active region along a second direction transverse to the first direction, wherein the first pair of gate regions and the first active region configure a first program transistor and a first read transistor sharing a common source/drain region; and
a first metal layer, comprising:
a first program word line pattern over and coupled to the gate region of the first program transistor,
a first read word line pattern over and coupled to the gate region of the first read transistor,
a first source line pattern coupled to another source/drain region of the first program transistor, and
a first bit line pattern coupled to another source/drain region of the first read transistor,
wherein an entirety of the first source line pattern and an entirety of the first bit line pattern are physically arranged, in the second direction, between the first program word line pattern and the first read word line pattern.

2. The IC device of claim 1, further comprising:
a plurality of metal layers over the first active region and the first pair of gate regions, the plurality of metal layers including the first metal layer,
wherein
among the plurality of metal layers, the first metal layer is a lowermost metal layer and closest to the first active region and the first pair of gate regions.

3. The IC device of claim 1, wherein
in the second direction, the first program word line pattern has a greater dimension than the first read word line pattern.

4. The IC device of claim 1, wherein
the first program word line pattern, the first read word line pattern, and the first source line pattern are elongated in the first direction, and
the first bit line pattern is elongated in the second direction.

5. The IC device of claim 1, further comprising:
a second pair of gate regions extending across the first active region in the second direction, wherein the second pair of gate regions and the first active region configure a second program transistor and a second read transistor sharing a common source/drain region, wherein
the first metal layer further comprises:
a second program word line pattern over and coupled to the gate region of the second program transistor, the second program word line pattern overlapping the first read word line pattern in the first direction, and
a second read word line pattern over and coupled to the gate region of the second read transistor, the second read word line pattern overlapping the first program word line pattern in the first direction.

6. The IC device of claim 5, wherein
the first metal layer further comprises a second source line pattern coupled to another source/drain region of the second program transistor,
the second read transistor has another source/drain region being the another source/drain region of the first read transistor, and
the first bit line pattern is physically arranged, in the first direction, between the first source line pattern and the second source line pattern.

7. The IC device of claim 6, wherein
the first source line pattern is electrically coupled to the second source line pattern.

8. The IC device of claim 5, wherein
along the first direction,
the second program word line pattern overlaps the first read word line pattern, and
the second read word line pattern overlaps the first program word line pattern.

9. The IC device of claim 1, further comprising:
a second metal layer over the first metal layer and comprising:
a program word line coupled to the first program word line pattern, and
a read word line coupled to the first read word line pattern; and
a third metal layer over the first metal layer and comprising:
a source line coupled to the first source line pattern, and
a bit line coupled to the first bit line pattern,
wherein
the program word line and the read word line extend along one of the first direction and the second direction, and
the source line and the bit line extend along the other of the first direction and the second direction.

10. The IC device of claim 1, further comprising:
a plurality of identical first memory cells and a plurality of identical second memory cells arranged in abutment with each other in a repeating pattern,
wherein
each second memory cell among the plurality of second memory cells is symmetrical to any first memory cell among the plurality of first memory cell across the first direction, and
each second memory cell among the plurality of second memory cells abuts, in the second direction, at least one first memory cell among the plurality of first memory cell.

11. An integrated circuit (IC) device, comprising:
a first active region extending along a first direction;
first through fourth gate regions extending across the first active region along a second direction transverse to the first direction, wherein
the first through fourth gate regions and the first active region correspondingly configure first through fourth transistors,
the first and second transistors share a first common source/drain region,
the second and third transistors share a second common source/drain region, and the third and fourth transistors share a third common source/drain region; and
a first metal layer, comprising:
first through fourth word line patterns over and correspondingly coupled to the first through fourth gate regions,
a first source line pattern coupled to a source/drain region of the first transistor other than the first common source/drain region,
a second source line pattern coupled to a source/drain region of the fourth transistor other than the third common source/drain region, the first source line pattern coupled to the second source line pattern, and
a first bit line pattern coupled to the second common source/drain region, the first bit line pattern physically arranged, along the first direction, between the first source line pattern and the second source line pattern.

12. The IC device of claim 11, wherein
the first source line pattern, the second source line pattern and the first bit line pattern are physically arranged, in the second direction, between (i) a pair of word line patterns among the first through fourth word line patterns and (ii) another pair of word line patterns among the first through fourth word line patterns.

13. The IC device of claim 11, wherein
in the second direction, the first and fourth word line patterns have a greater dimension than the second and third word line patterns.

14. The IC device of claim 11, wherein
the first through fourth word line patterns, the first source line pattern and the second source line pattern are elongated in the first direction, and
the first bit line pattern is elongated in the second direction.

15. The IC device of claim 11, wherein
along the first direction,
the first word line pattern overlaps the third word line pattern,
the second word line pattern overlaps the fourth word line pattern, and
the first source line pattern, the second source line pattern and the first bit line pattern overlap each other.

16. An integrated circuit (IC) device, comprising:
a first active region extending along a first direction;
a second active region extending along the first direction, and spaced from the first active region along a second direction transverse to the first direction;
first and second gate regions extending along the second direction and across the first and second active regions, wherein
the first and second gate regions correspondingly configure, together with the first active region, first and second transistors,
the first and second transistors share a first common source/drain region,
the first and second gate regions correspondingly configure, together with the second active region, third and fourth transistors, and
the third and fourth transistors share a second common source/drain region; and
a first metal layer, comprising:
a first word line pattern over and coupled to the first gate region,
a second word line pattern over and coupled to the second gate region,
a third word line pattern over and coupled to the first gate region,
a first source line pattern coupled to a source/drain region of the first transistor other than the first common source/drain region,
a second source line pattern coupled to a source/drain region of the third transistor other than the second common source/drain region,
a first bit line pattern coupled to a source/drain region of the second transistor other than the first common source/drain region, and
a second bit line pattern coupled to a source/drain region of the fourth transistor other than the second common source/drain region,
wherein
the first source line pattern and the first bit line pattern are physically arranged, along the second direction, between the first word line pattern and the second word line pattern, and
the second source line pattern and the second bit line pattern are physically arranged, along the second direction, between the second word line pattern and the third word line pattern.

17. The IC device of claim 16, wherein
in the second direction, the first word line pattern and the third word line pattern have a greater dimension than the second word line pattern.

18. The IC device of claim 16, wherein
the first through third word line patterns, the first source line pattern and the second source line pattern are elongated in the first direction, and
the first bit line pattern and the second bit line pattern are elongated in the second direction.

19. The IC device of claim 16, wherein
along the first direction,
the first source line pattern overlaps the first bit line pattern, and
the second source line pattern overlaps the second bit line pattern.

20. The IC device of claim 16, further comprising:
a second metal layer over the first metal layer and comprising:
a program word line coupled to the first word line pattern and the second word line pattern, and
a read word line coupled to the third word line pattern; and
a third metal layer over the first metal layer and comprising:
a first source line coupled to the first source line pattern,
a second source line coupled to the second source line pattern,
a first bit line coupled to the first bit line pattern, and
a second bit line coupled to the second bit line pattern,
wherein
the program word line and the read word line extend along one of the first direction and the second direction, and
the first and second source lines and the first and second bit lines extend along the other of the first direction and the second direction.

* * * * *